(12) United States Patent
Fraser et al.

(10) Patent No.: US 6,587,056 B1
(45) Date of Patent: Jul. 1, 2003

(54) SOLID STATE FLIGHT DECK MODULES AND COMPONENTS THEREOF

(75) Inventors: Charles R. Fraser, Kent, WA (US); Robert W. Metzger, Marysville, WA (US); Marshall T. Okamoto, Seattle, WA (US); Dwight R. Schaeffer, Mercer Island, WA (US); Richard A. Bohlander, Snohomish, WA (US); Toan D. Le, Seattle, WA (US); Barrie W. Hughlock, Redmond, WA (US); Richard M. Schatz, Renton, WA (US); Rex McCleary, Everett, WA (US)

(73) Assignee: The Boeing Company, Seattle, WA (US)

(*) Notice: Subject to any disclaimer, the term of this patent is extended or adjusted under 35 U.S.C. 154(b) by 0 days.

(21) Appl. No.: 09/540,103

(22) Filed: Mar. 31, 2000

Related U.S. Application Data

(63) Continuation-in-part of application No. 09/231,268, filed on Jan. 15, 1999, now abandoned.

(51) Int. Cl.$^7$ ............................................. G08B 21/00
(52) U.S. Cl. ........................... 340/945; 341/22; 341/32; 336/130; 361/680; 361/697; 361/704; 361/707; 361/714; 361/748; 361/753; 361/760; 200/61.39; 200/51 R; 200/11 R; 345/156; 345/168; 345/184
(58) Field of Search ................................. 340/945, 988, 340/998; 341/32, 22; 336/130; 361/680, 681, 697, 704, 816, 736, 707, 709, 742, 713, 748, 714, 752, 760, 388, 725, 724, 753, 387, 749; 338/69, 128, 344, 296; 200/51 R, 52 R, 11 R, 61.39, 51.17, 173; 345/168, 156, 184

(56) References Cited

U.S. PATENT DOCUMENTS

| | | | | |
|---|---|---|---|---|
| 3,754,243 A | * | 8/1973 | Kaneko et al. | 340/815.55 |
| 3,810,167 A | | 5/1974 | Shepard, Jr. | 341/32 |
| 3,851,328 A | * | 11/1974 | Sottile et al. | 345/156 |
| 4,054,860 A | * | 10/1977 | Henderson et al. | 338/32 H |
| 4,166,200 A | * | 8/1979 | Reichen et al. | 200/11 R |
| 4,177,499 A | * | 12/1979 | Volkmann | 361/388 |
| 4,186,342 A | * | 1/1980 | Kyle | 455/76 |
| 4,366,436 A | | 12/1982 | Barker | 324/379 |
| 4,417,200 A | * | 11/1983 | Weintraub et al. | 323/347 |

(List continued on next page.)

FOREIGN PATENT DOCUMENTS

| | | |
|---|---|---|
| GB | 2332395 | 6/1999 |
| WO | WO 98/48848 | 11/1998 |

*Primary Examiner*—Benjamin C. Lee
(74) *Attorney, Agent, or Firm*—Christensen O'Connor Johnson Kindness PLLC

(57) ABSTRACT

A conventional light plate for a systems control panel is mounted on a machined front plate which, in turn, is maintained a predetermined uniform distance from a front printed wiring assembly (PWA). A plurality of systems control devices including one or more of switches (toggle switches, rotary switches, push button switches), rheostats and annunciators are mounted on the front plate and front PWA. Each of the systems control devices has one or more solid state elements mounted on the PWA. For example, the switches carry small magnets which, by manipulation of operating switch levers or knobs, move into and out of close proximity to magnet sensitive switching devices mounted on the front PWA.

36 Claims, 30 Drawing Sheets

U.S. PATENT DOCUMENTS

| | | | | |
|---|---|---|---|---|
| 4,489,303 A | * | 12/1984 | Martin | 338/128 |
| 4,494,109 A | * | 1/1985 | Bernin | 341/32 |
| 4,529,967 A | * | 7/1985 | Gifft | 341/32 |
| 4,679,033 A | * | 7/1987 | Hwang | 340/566 |
| 5,173,839 A | * | 12/1992 | Metz, Jr. | 361/387 |
| 5,255,155 A | * | 10/1993 | Sugimoto et al. | 361/749 |
| 5,535,095 A | | 7/1996 | Slater et al. | 361/725 |
| 5,570,114 A | * | 10/1996 | Fowler | 345/173 |
| 5,861,796 A | * | 1/1999 | Benshoff | 338/32 H |
| 6,154,201 A | * | 11/2000 | Levin et al. | 345/184 |

* cited by examiner

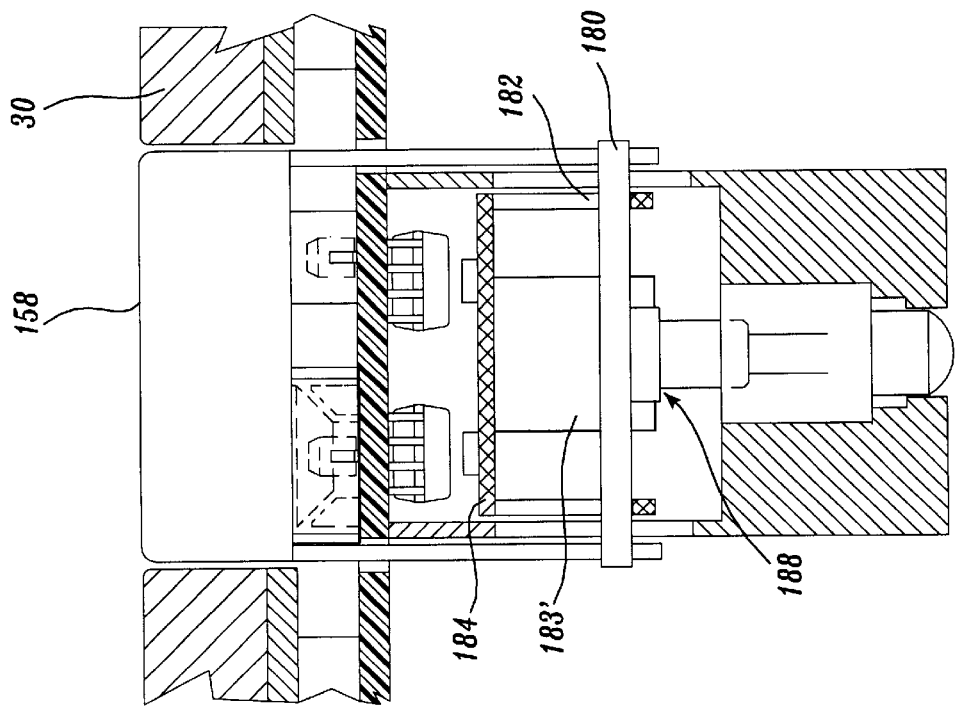
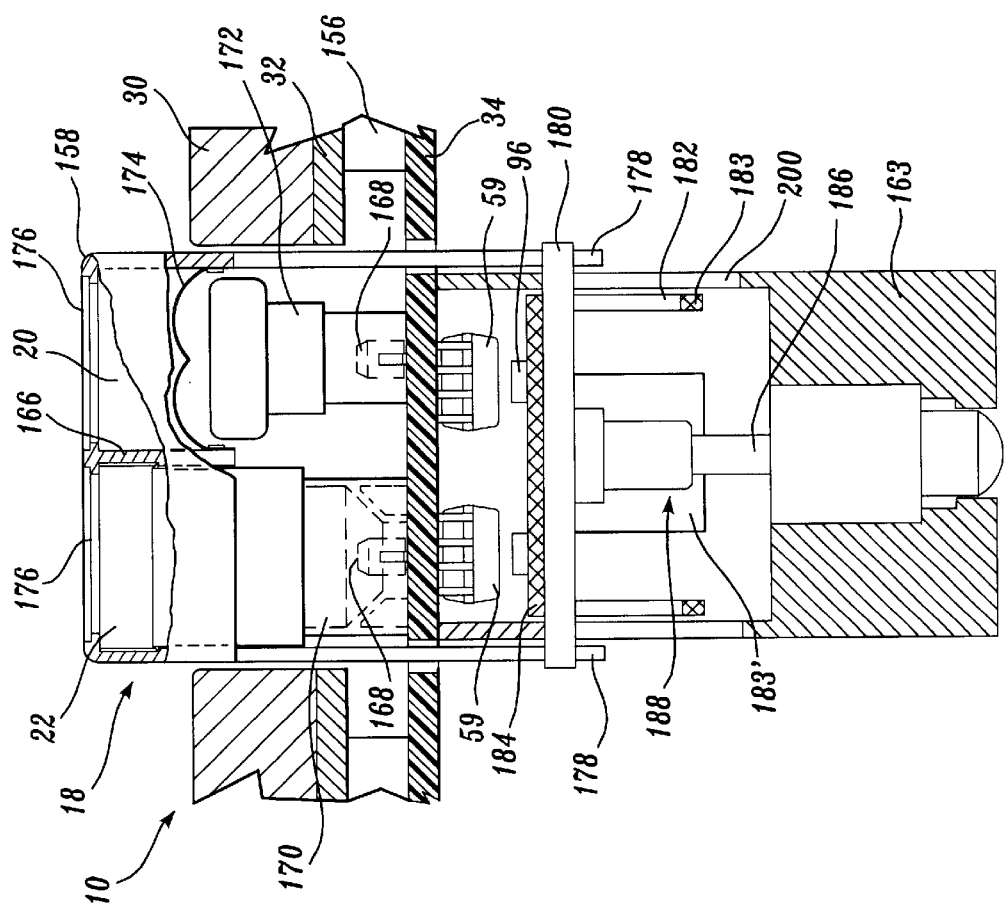

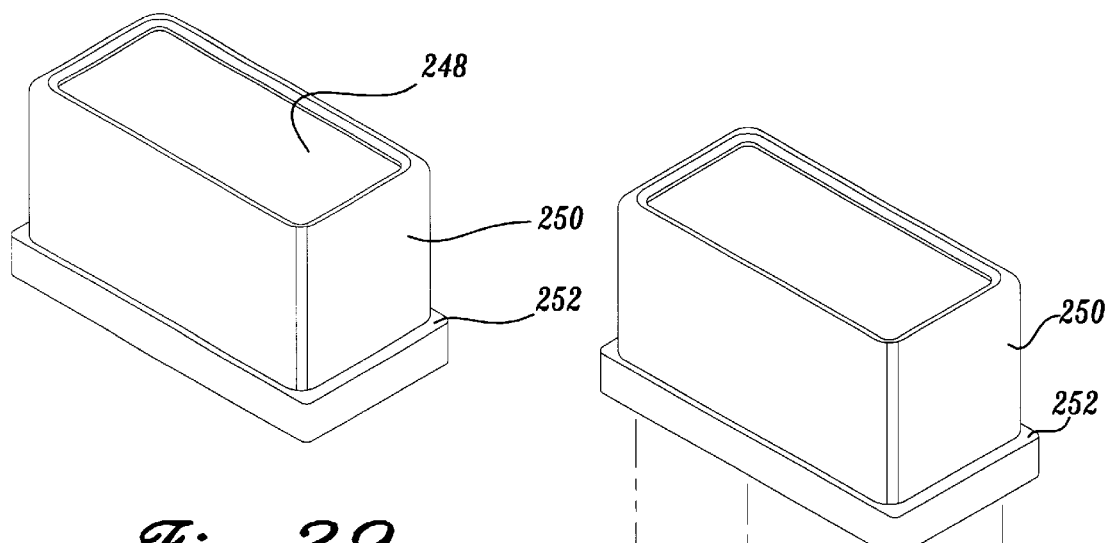
Fig. 29.
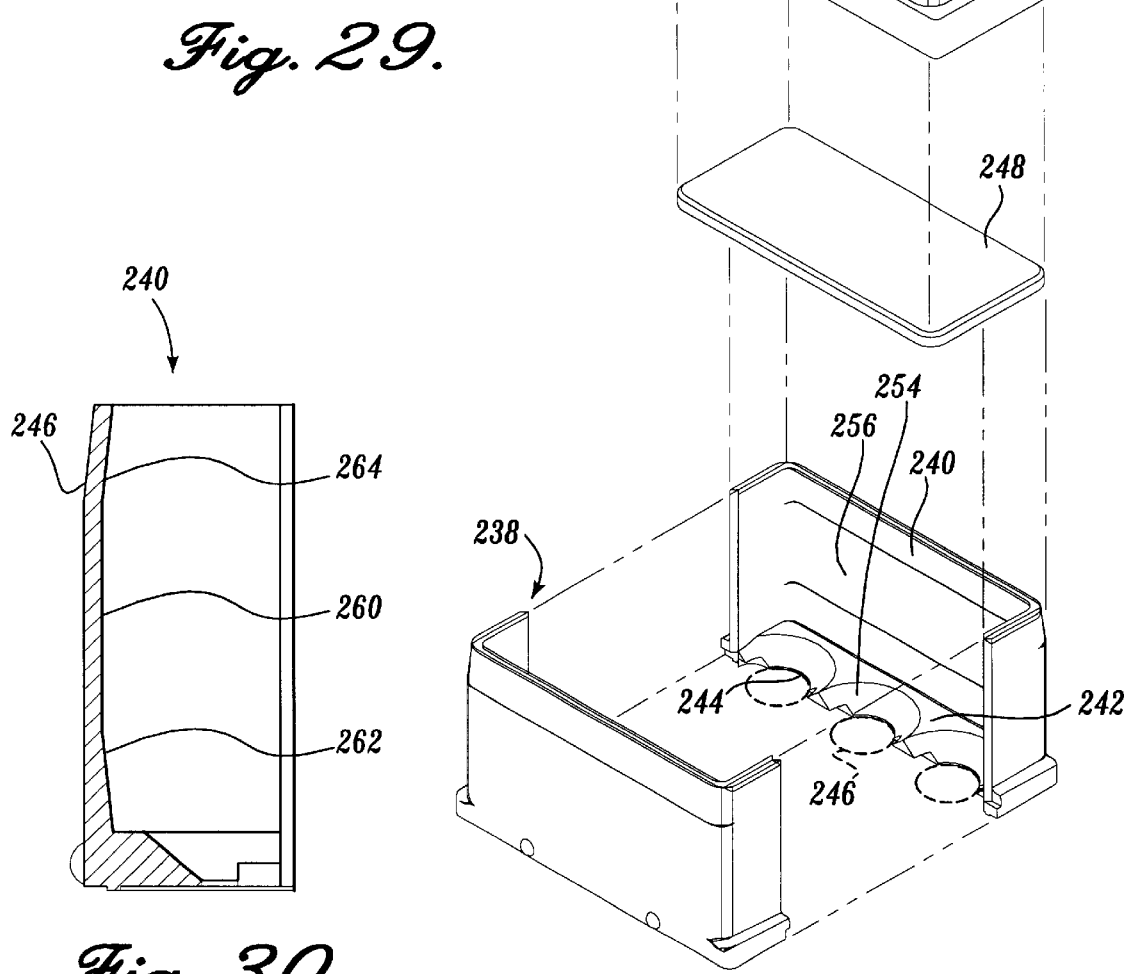
Fig. 30.
Fig. 28.

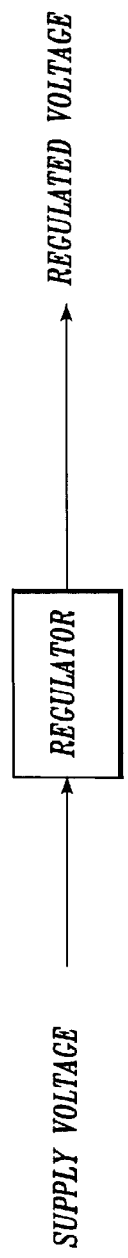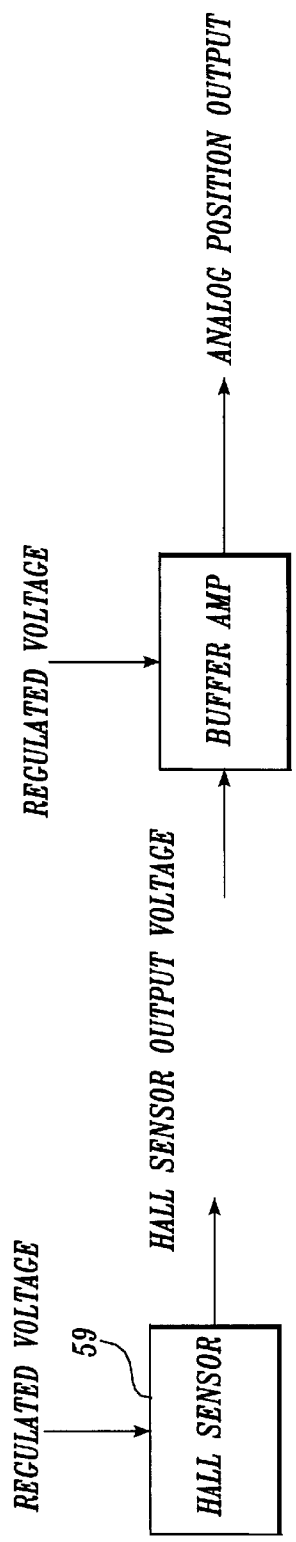

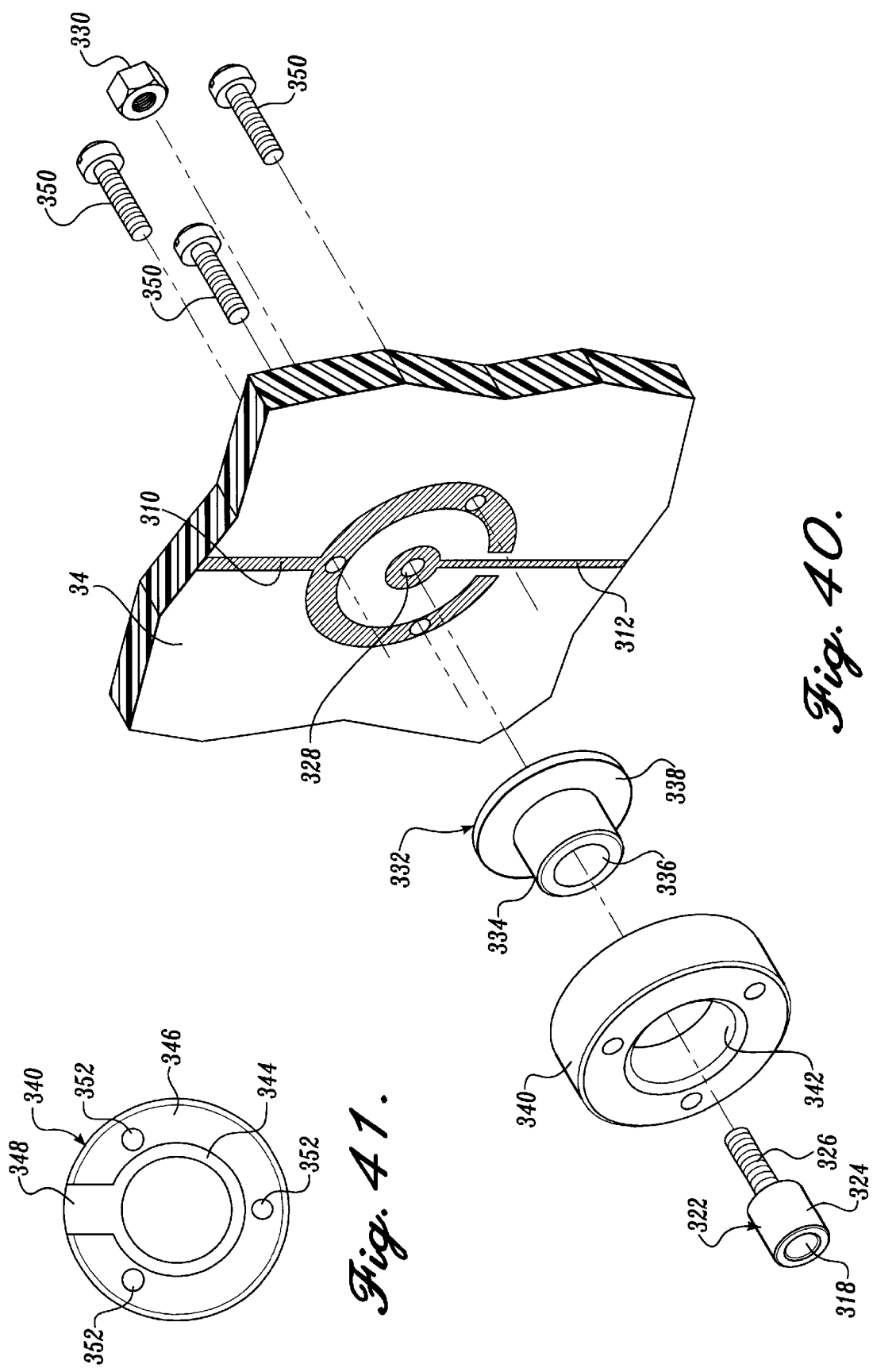

SOLID STATE FLIGHT DECK MODULES AND COMPONENTS THEREOF

CROSS-REFERENCE TO RELATED APPLICATION

This application is a continuation-in-part of U.S. application Ser. No. 09/231,268, filed on Jan. 15, 1999.

FIELD OF THE INVENTION

The present invention relates to systems control modules having switches, control knobs and/or indicators, particularly flight deck panels for aircraft which may include light plates and control devices such as toggle switches, rotary switches, lighted and nonlighted push button switches, rheostats, and indicator lights.

BACKGROUND OF THE INVENTION

The flight deck (cockpit) area of a modem commercial aircraft includes an extremely large number of different types of switches and status indicating lights (annunciators) for different aircraft system control functions. Due to the large number of control and indicating devices, they are arranged in modules, encompassing large areas viewable and reachable by the flight crew. Modules having similar control or indicating functions may be arranged and located similarly in the flight decks of different aircraft, for ease of use by the flight crew. Also, similar switches, both with respect to look and feel, are provided for similar functions. For example, a small flight deck module may incorporate a row of toggle switches for on-off operation of aircraft lights (beacon, navigation, strobe, wing, and so on) arranged at approximately the same location in different aircraft with differently shaped operating levers for tactile recognition by a pilot. Other systems may be controlled by rotary switches push button switches, or rheostats. A particular panel may or may not incorporate annunciators, and some panels may consist solely of banks of annunciators to indicate the status of different flight control systems.

The electrical systems controlled by the various switches and indicated by the various annunciators operate from standardized electrical power. In addition, flight crews have become accustomed to the look and feel of past flight deck panels and modules, which typically include incandescent lights for annunciators which operate similarly in terms of brightness for corresponding annunciators of different aircraft. The flight control modules have been designed to allow replacement of failed incandescent annunciator lights. This requires mechanical components that can be opened or disassembled for access to the lights. Special materials and heat tolerant and heat dissipating components also are required adjacent to the lights. As noted above, provision must be made for different types of switches, and also for switches of different manufacturers. Switch contacts become worn over time, necessitating switch replacement and rewiring. Many modules will have several switches and several different types of switches, each of which must be hard wired to a control circuit, in addition to the front light plate with a standard connector to supply power for lighting the panel. Nevertheless, it is desirable that a reasonably small number of system connectors be provided for each panel, for ease of installation, replacement, and repair. Thus, wires from several individual switches and annunciators typically are bundled and soldered to system connectors.

SUMMARY OF THE INVENTION

The present invention provides a novel systems control panel and novel components, namely, different types of switches and annunciators, having common dimensions, interchangeability with respect to existing panels, and the same tactile and visual human interface with the panels. The new panels also are of much greater reliability and less weight, incorporate component parts appropriate for automated manufacture and are easier to install and maintain. In fact, it is envisioned that virtually no maintenance will be required for the life of the aircraft, including no need for switch or annunciator light replacement.

In one aspect of the present invention, a systems control panel includes a standard light plate having the same characteristics as the light plate of the panel being replaced. The light plate is mounted on a machined front plate. A front printed wiring board or assembly (PWA) is mounted a predetermined uniform distance behind the machined front plate, and can incorporate a connector to mate with the electrical connector of the light plate. Actuation and annunciator components are mounted in the machined front plate and carry magnets that cooperate with Hall effect devices on the front PWA. For example, in the described embodiment the switches carry small magnets which, by manipulation of operating switch levers or knobs, move into and out of close proximity to magnet sensitive switching devices mounted on the front PWA. No mechanical contacts are required, and the switch actuating components are not mounted internally of discrete switches. Rather than hard wiring each switch, all circuits are routed within the PWA. To allow room for components mounted to the rear of the front PWA, a second or rear printed wiring assembly (PWA) can be provided, spaced a greater distance rearward from the front PWA and connected thereto by compliant pin connectors. On the back of the rear wiring board, standard system connectors are provided, compatible with system connectors of prior art system control panels, typically compliant pin connectors. When the design has been completed, the improved panel can be substituted for the preexisting panel with no additional alterations being required.

In another aspect of the present invention, the machined front plate and PWAs form a heat conductive assembly. The PWAs can have the usual power and ground planes and, additionally, one or more thermal planes, thermal vias, and heat conductive surface areas for engagement with a heat conductive housing. Heat from heat producing components secured on the PWAs is transferred by way of the thermal plane or planes, vias and surface conductors to the front plate and the housing for efficient dissipation of heat. The front PWA, including thermal planes and vias, is designed for a significant amount of thermal isolation of one side of the PWA from the other, while promoting heat conduction to the edges in contact with the heat conductive and heat dissipating housing.

Toggle switches which have actuating levers that swing in one plane can have rear end portions carrying magnets moved into and out of close proximity to Hall effect sensors stationarily mounted on the front PWA. Rotary switches can have magnets rotated into an out of close proximity to Hall effect devices mounted on the front PWA. Push button switches can have magnet carriers moved linearly toward and away from Hall effect devices mounted on the front PWA. Rheostat devices can have magnet carriers moved progressively toward or away from Hall effect devices mounted on the front PWA. For each device, appropriate circuitry is provided so that its operation emulates mechanical switches previously in use.

In another aspect of the invention, annunciator lights are LEDs which have a longer life and more reliable operation than incandescent lights. A plurality of LEDs can be provided for each annunciator, increasing reliability to the extent that routine replacement is not required. Thus, simpler mechanical constructions can be provided, and cheaper, lower temperature resistant materials used. In addition, since no hard wiring of individual switches is required, a considerable amount of bulk and weight is eliminated. For many control panels, the novel panels in accordance with the present invention will be several times smaller in terms of volume than corresponding panels currently in use.

In another aspect of the present invention, annunciator LEDs are enclosed in an annunciator housing, such LEDs being mounted directly on the front PWA, increasing the standardization of design and manufacture. Specialized reflectors and lenses are provided to increase viewability of annunciator indicia, particularly at sizable side angles.

In yet other aspects of the invention, improved switches are provided including toggle switches having cams for controlling detent positions, multiple rotary switches, and multiple rheostats incorporated within a single casing. Nevertheless, all switches are designed for mounting in the machined front plate to cooperate with Hall effect sensors mounted on the front PWA, for standardization of design.

In other aspects of the present invention, circuitry is provided for each systems control panel component for emulating operation of prior panels, such as by controlling operation of annunciator lights to resemble operation of incandescent lights, and providing circuitry compatible with standard system connectors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 22A–22D are corresponding side elevations thereof with parts broken away.

FIG. 28 is a top front perspective of component parts of the annunciator of FIG. 27, with parts shown in exploded relationship, FIG. 29 is a top front perspective of the annunciator of FIG. 28 with parts assembled, FIG. 30 is an end elevation of a component of the annunciator of FIG. 28, namely, a reflector, with parts broken away.

FIGS. 35–38 are block diagrams of additional circuits useable in the present invention;

FIG. 40 is a corresponding fragmentary top perspective with parts shown in exploded relationship, FIG. 41 is a rear elevation of the electrical connector of the printed wiring assembly.

DETAILED DESCRIPTION OF THE PREFERRED EMBODIMENT

Figure 1:
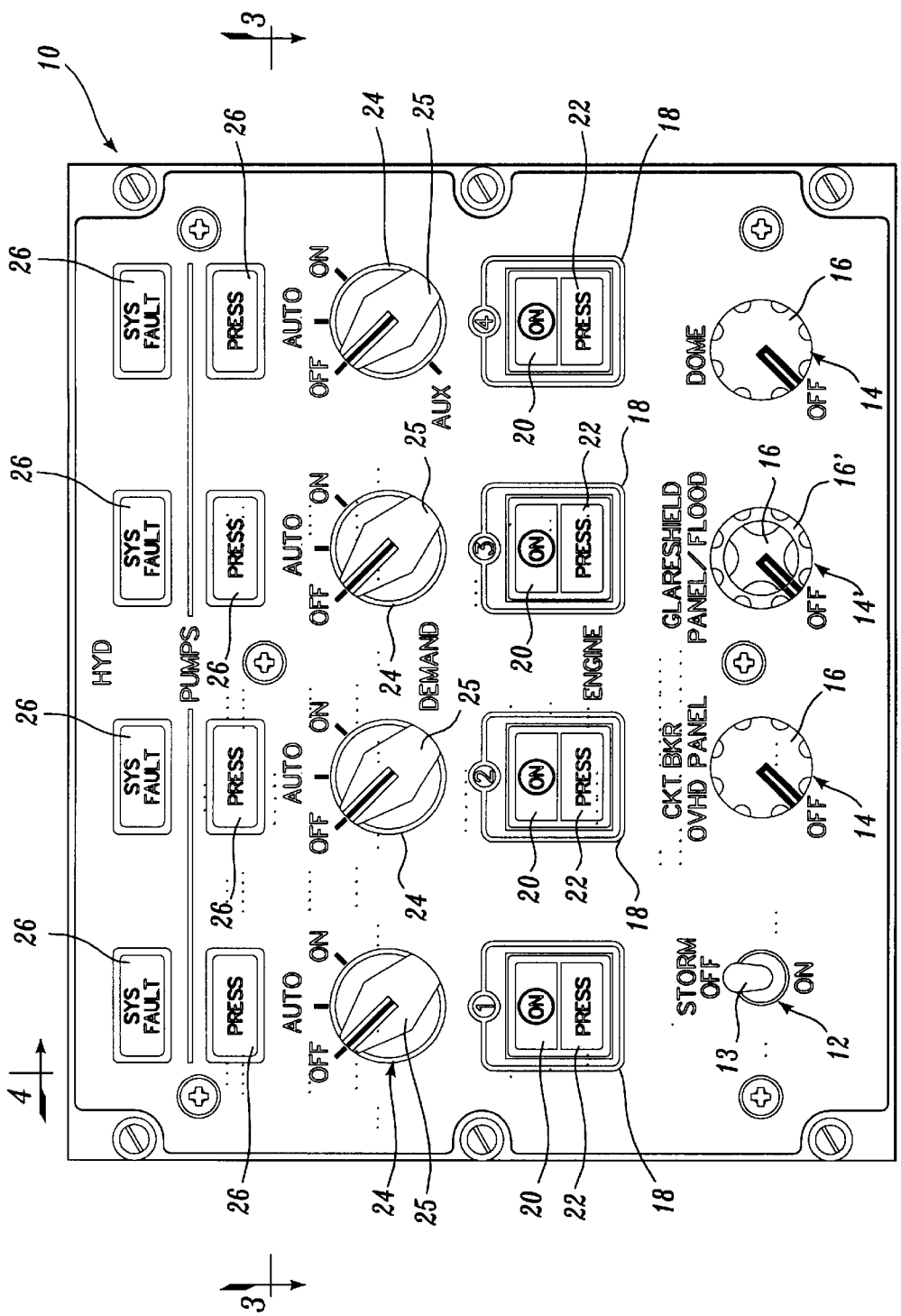
FIG. 1 is a front elevation of a solid state flight deck module in accordance with the present invention.

The present invention uses a variety of technologies combined in a unique way to create a new type of aircraft systems control panel resulting in reduced weight, reduced size, lower cost, and significantly higher reliability. Panels designed utilizing elements of this invention are interchangeable with existing panels, having the same mounting components, tactile and visual human interface, and connection components compatible with those currently in use. FIG. 1 illustrates the face of a representative panel 10 in accordance with the present invention, which is identical in appearance and, to the crew member, operation as a preexisting panel of conventional construction. Nevertheless, the construction of the improved panel 10 is vastly different, lighter, less bulky, and requires none of the routine maintenance required for the panel which it replaces.

The panel of FIG. 1 was selected for illustration and prototyping because of the variety of types of switches and indicating systems used. At the lower left, a toggle switch 12, with an operating lever 13 that swings in one plane (up and down) between "On" (closed) and "Off" (open) positions, is adjacent to a bottom row of rotary rheostats 14 and 14'. The rheostats 14 at the ends of the row have single cylindrical operating knobs 16. The middle rheostat 14' has an outer annular knob 16' for controlling one function and an inner cylindrical knob 16 for controlling another function. Immediately above the toggle switch 12 and rheostats 14 and 14' is a row of push button switches 18. Switches 18 are of a type having shuttered indicator light sections 20 and independently lit lower sections 22. Proceeding upward, there is a row of rotary switches 24 having multiple detent positions for their operating knobs 25. At the top of the panel 10 are two rows of annunciators 26 with internal lights. The panel of FIG. 1 corresponds to a composite of two of many panel modules of a Boeing 747 aircraft. In the prior art design, switches of different manufacturers are selected and mounted in a mounting panel and hardwired to appropriate control circuitry, the wires being connected into bundles for standardized system connectors at the rear.

Figure 2:
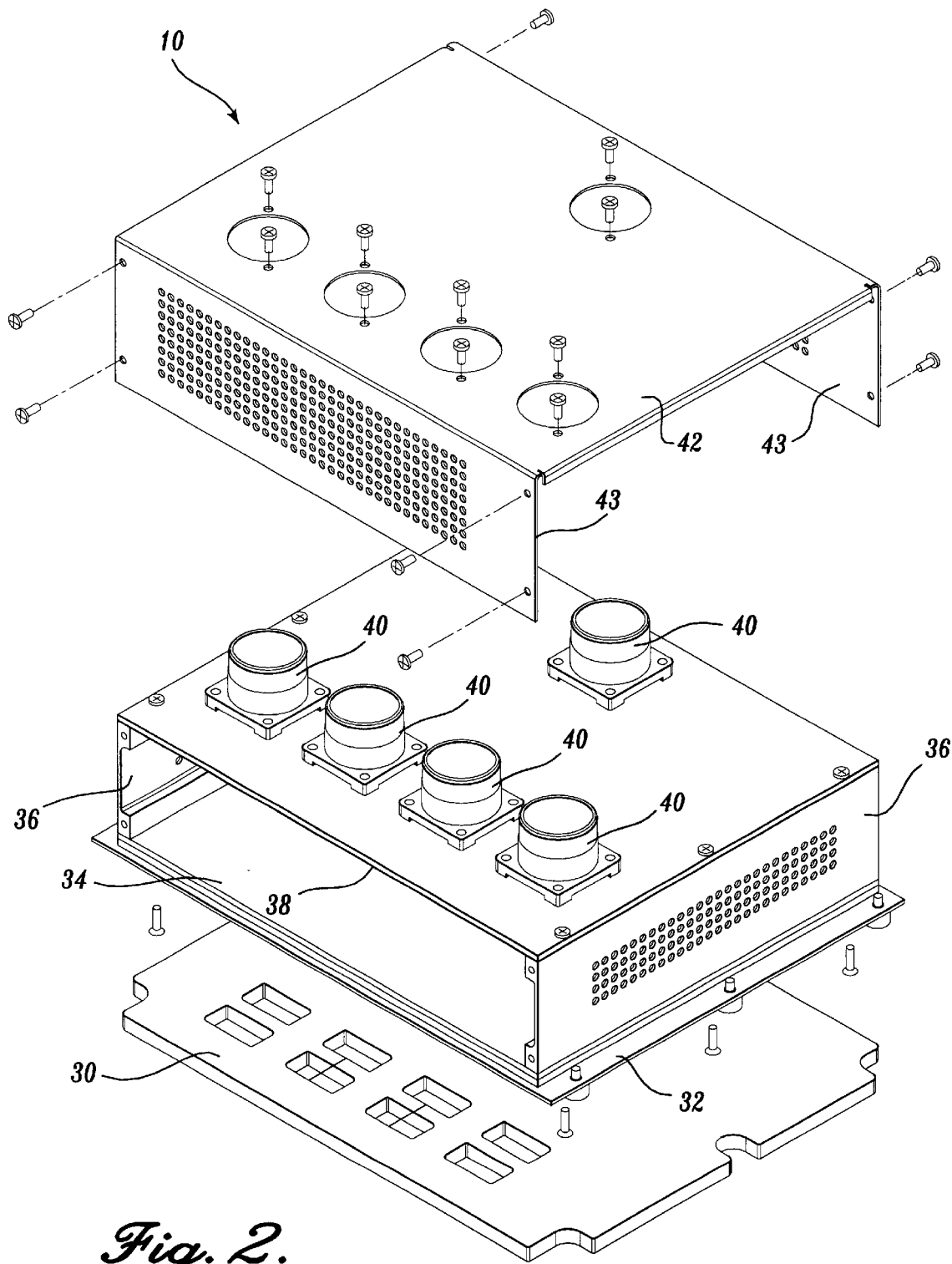
FIG. 2 is a rear perspective of the module of FIG. 1, with parts shown in partially exploded relationship.

FIG. 2 shows some of the components of the systems control panel 10 in accordance with the present invention in partially exploded relationship. A standard light plate 30 is mounted on a machined front plate 32. As described below, plate 32 has bosses and standoffs for supporting a first or front printed wiring board or assembly (PWA) 34. As also described in more detail below, front PWA 34 has LEDs for the annunciators and Hall effect sensors for magnets carried by movable switch components. Side rails 36 space the front PWA 34 from a second or rear PWA 38. PWAs 34 and 38 have their circuits connected by standardized press-in, compliant pin connectors, but other technologies could be used for interconnecting the circuits of two PWAs. At any rate, no discrete wiring is required for the systems control devices which include the switches, rheostats and annunciators. The rear PWA 38 is designed for connection of standard system connectors 40 of the type currently used, such as compliant pin connectors, which are coupled to the circuitry of the front and rear PWAs. The top, bottom, and back of the assembly are closed by a rear cover 42. All that projects from the rear of the improved panel 10 are the standard system connectors 40 which mate with complemental connectors of the aircraft control systems.

Figure 3:
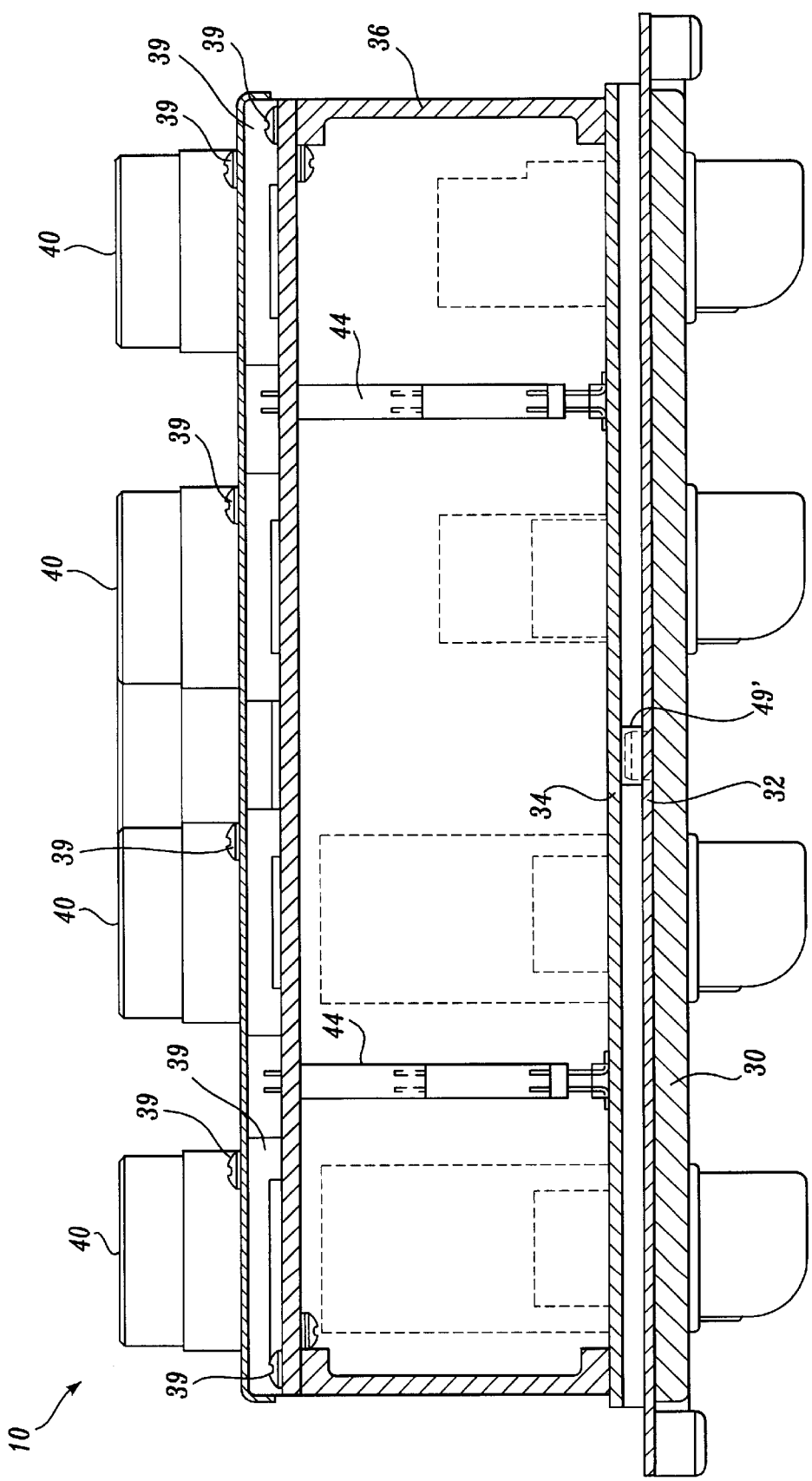
FIG. 3 is a section along line 3—3 of FIG. 1.
Figure 4:
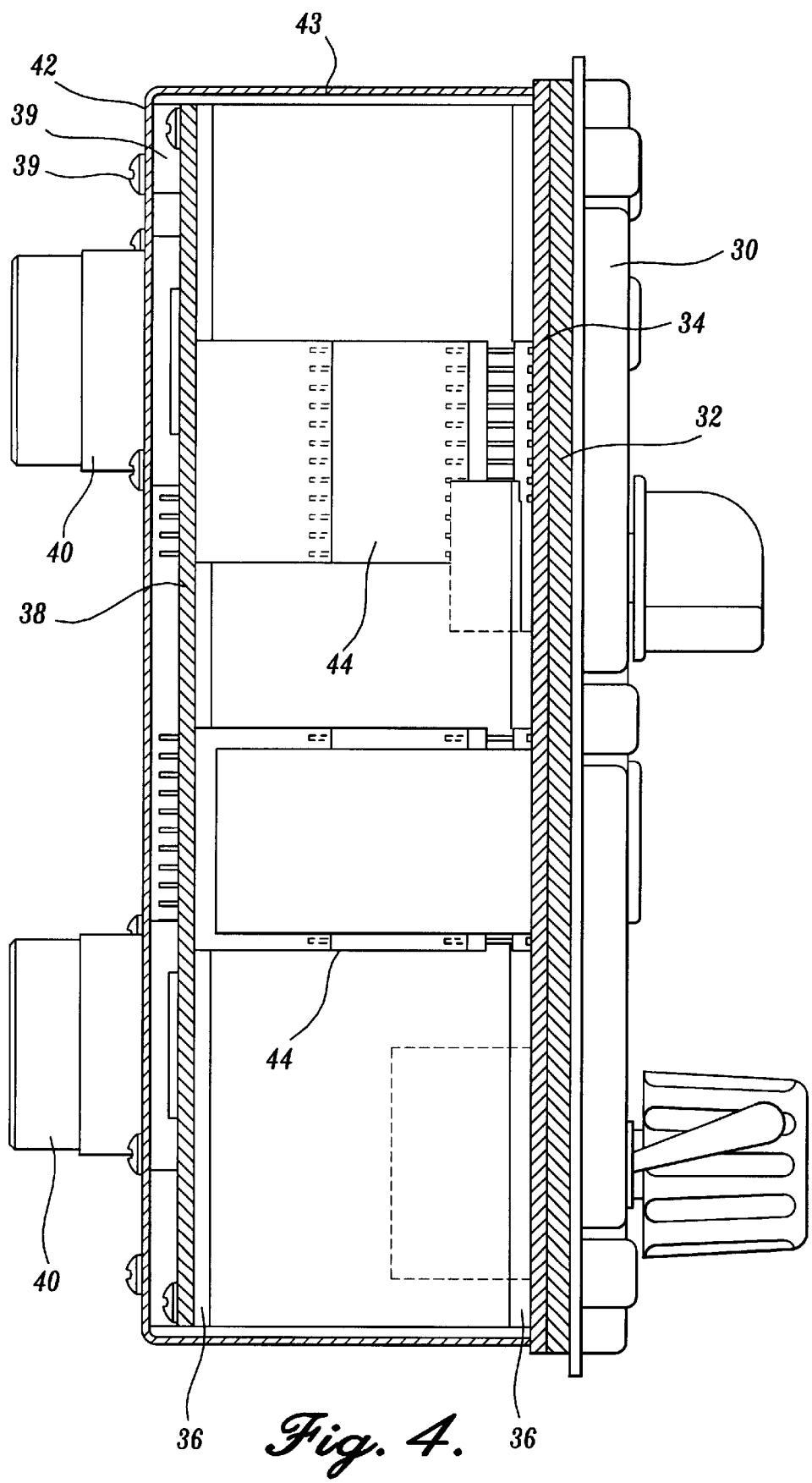
FIG. 4 is a section along line 4—4 of FIG. 1.
Figure 5:
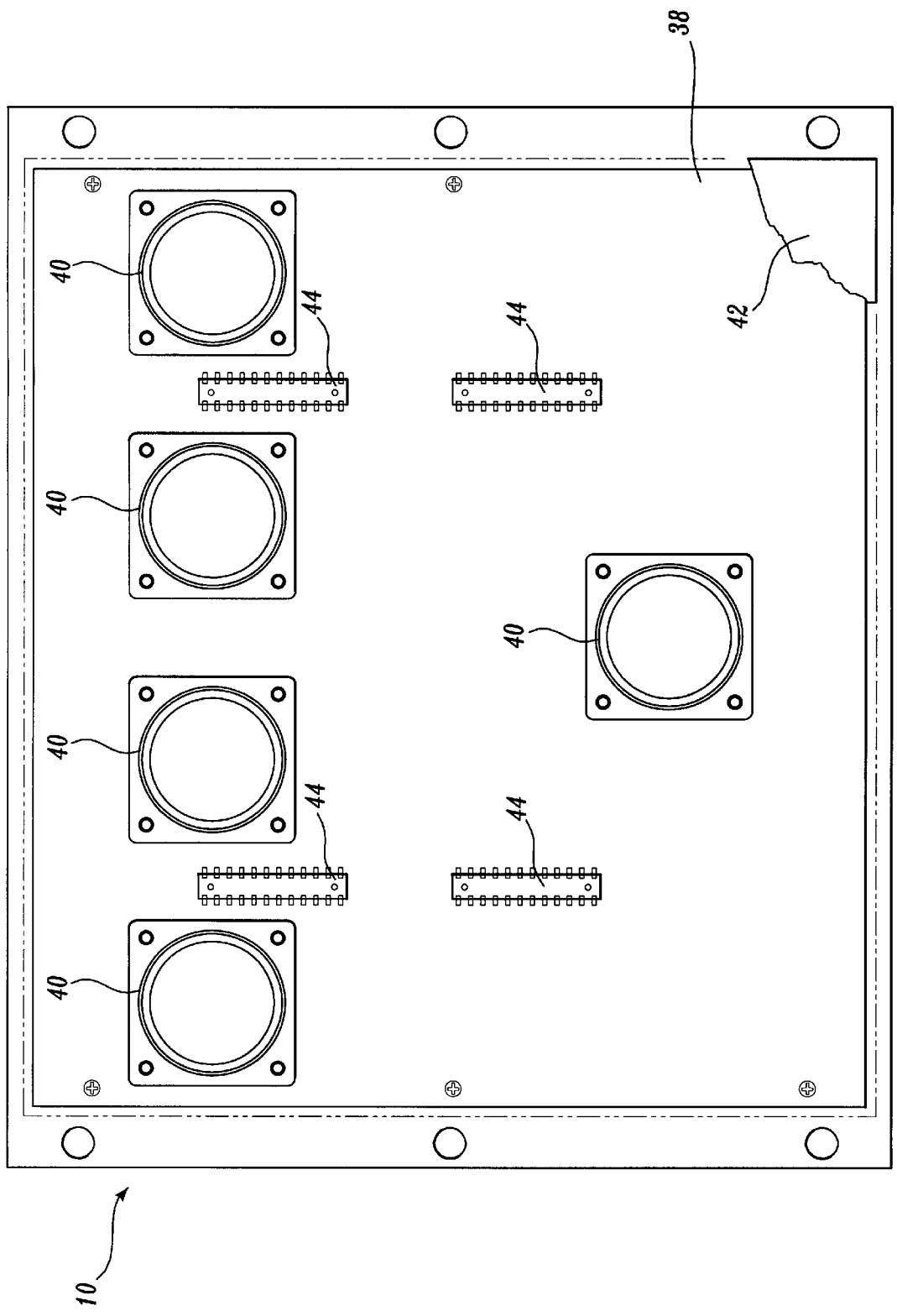
FIG. 5 is a rear elevation view of the module of FIG. 1, with parts broken away.

In FIG. 3, the standard press-in connectors 44 can be seen, and the side rails 36 extending between corresponding side margins of the front and rear PWAs 34 and 38. Also seen are the comparative distances between the front machined panel 32, front PWA 34, and rear PWA 38. The connectors 44 also are seen in FIG. 4, as well as the opposite sides 43 of the rear cover 42 which are in thermal contact with the front and rear PWAs and, through the mounting screws and studs 39, the side rails 36. In FIGS. 3 and 4, some of the internal switch components that are described in detail below are shown diagrammatically in broken lines and some are removed. The positions of the rear connectors 40 and interwiring board connectors 44 are also seen in FIG. 5.

Figure 7:
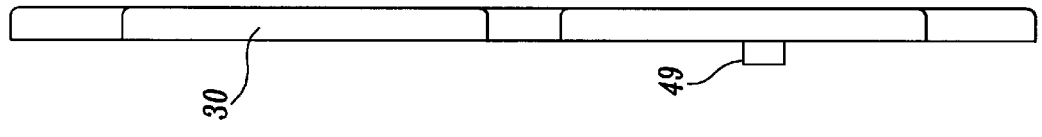
FIG. 7 is a side elevation thereof.
Figure 6:
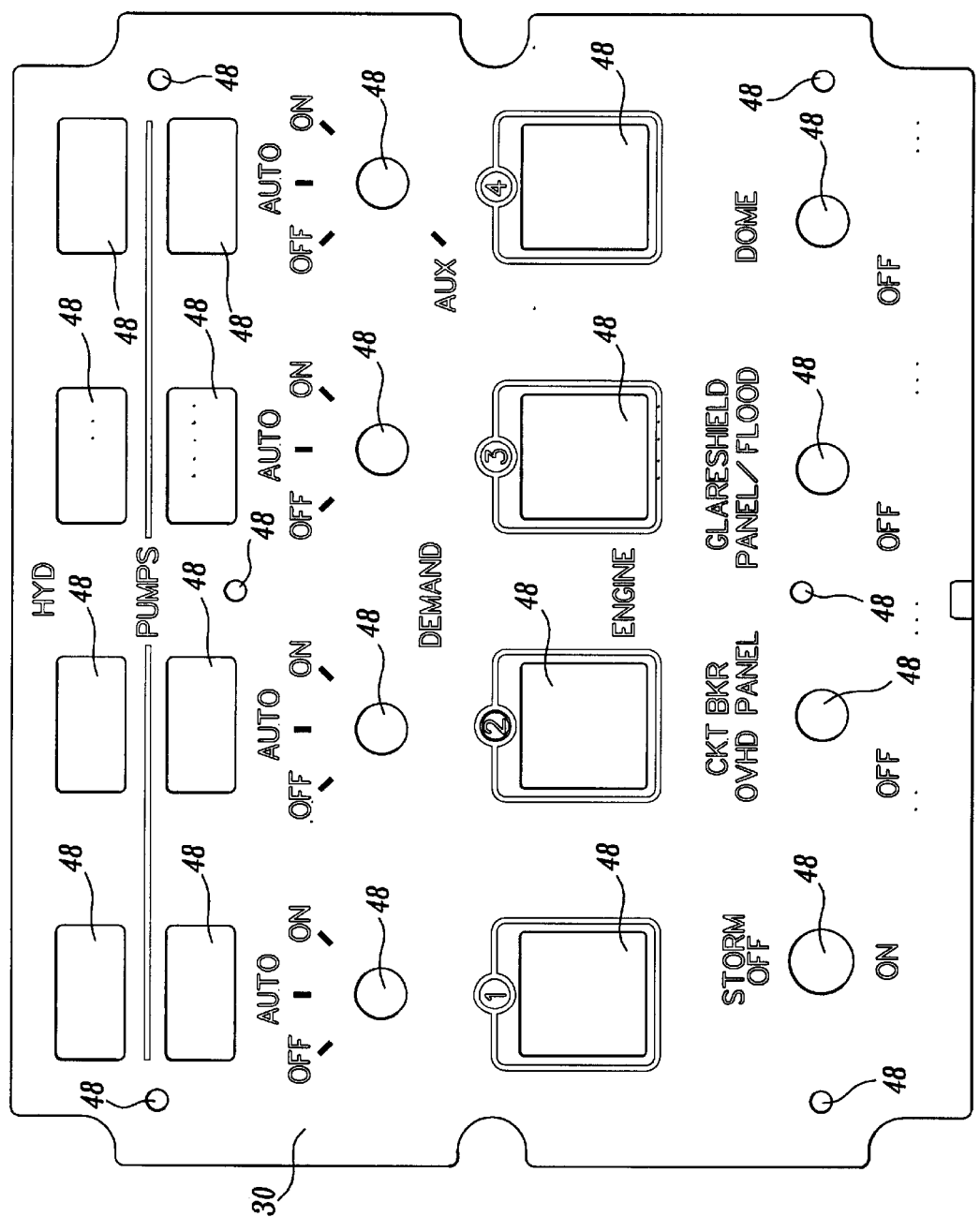
FIG. 6 is a front elevation of a component of the module of FIG. 1, namely, the front light plate.
Figure 8:
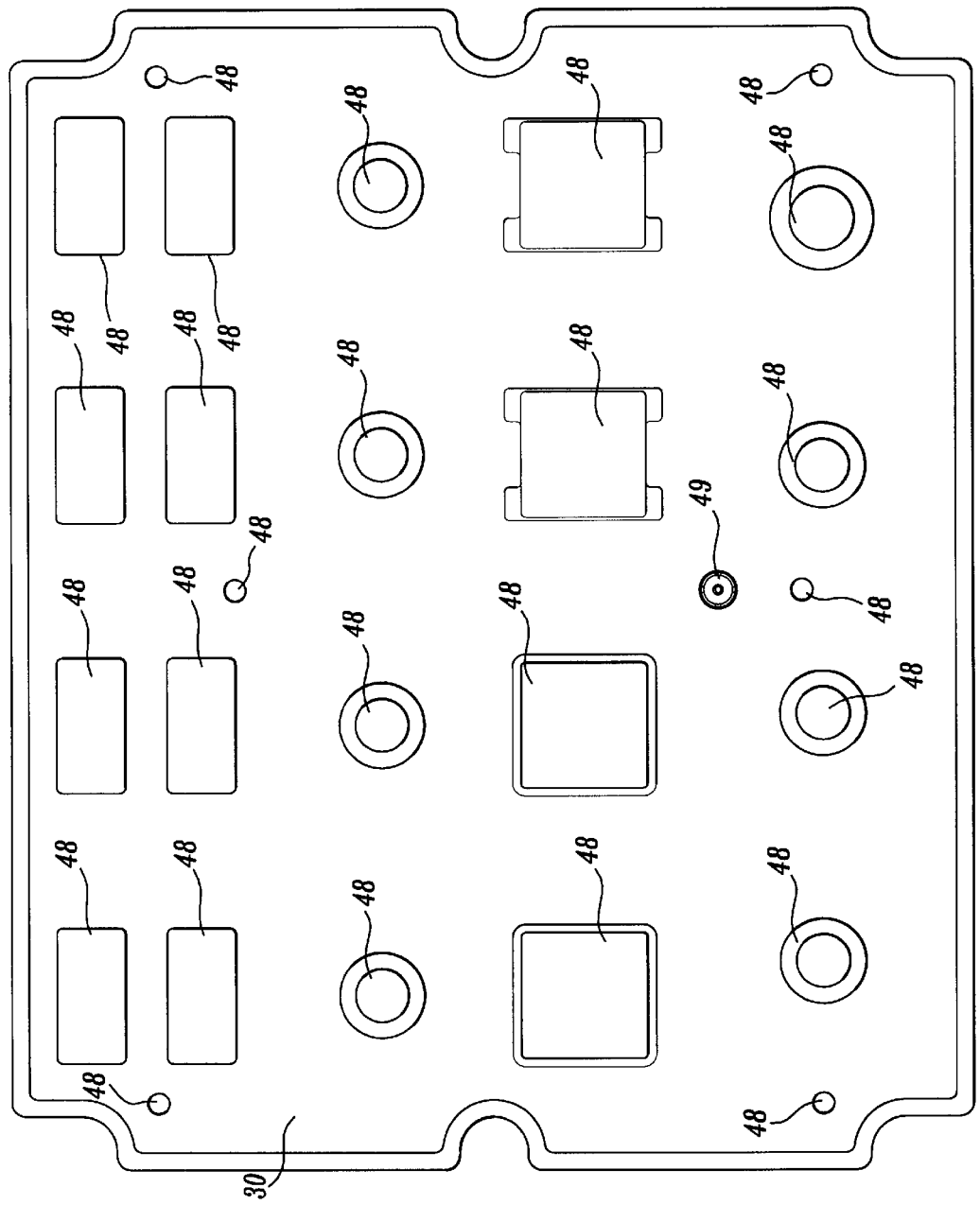
FIG. 8 is a rear elevation thereof.

The front light plate 30 is shown in FIGS. 6–8. Holes 48 are provided for parts of the various switches and annunciators, as well as mounting screws. The light plate is identical to that previously used, including an electrical connector 49 on its rear face seen in FIGS. 7 and 8. In general, the face of the light plate is opaque, with the lettering being transparent or translucent so that the lettering is visible to the flight crew. The light plate fastens directly to the front of the machined front plate.

Figure 9:
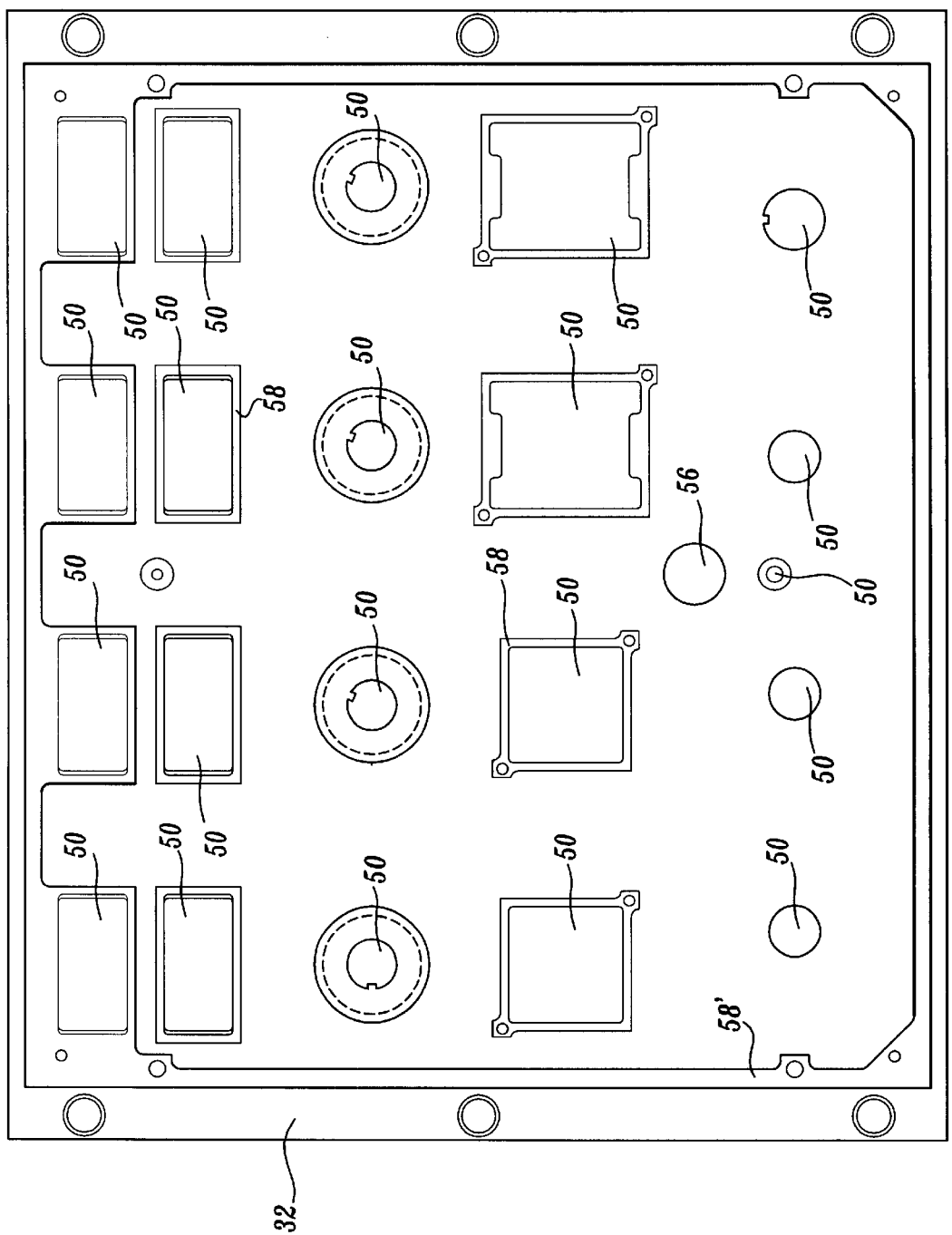
FIG. 9 is a rear elevation of another component of the module of FIG. 1, namely, a machined front plate.
Figure 10:
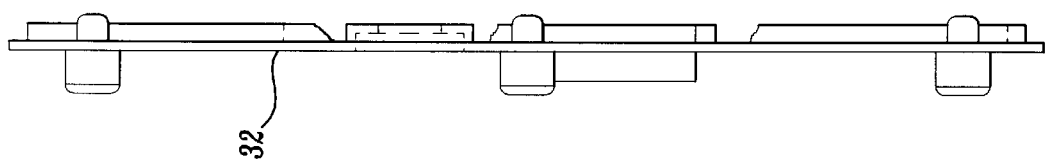
FIG. 10 is side elevation thereof.

The machined front plate 32 shown in FIG. 9 (rear face) and FIG. 10 (side elevation) preferably is formed of a nonmagnetic, heat conductive material such as aluminum, and has openings 50 corresponding generally to the shape and locations of the light plate openings 48. Opening 56 is aligned with and provides access to the light plate power connector 49 (FIG. 8). In some instances, ribs or shoulders are provided to act as keys for positive positioning of the components that pass through the openings. In addition, one or more short standoffs or raised rims 58 are provided to achieve the desired uniform spacing between the front plate 32 and front PWA 34 attached to the front plate, including a peripheral rim 58'. In the preferred embodiment, the spacing between the front plate and the adjacent face of the front PWA is uniformly 0.125 inch regardless of the type or combination of switches or annunciators used in the panel. This greatly simplifies the design of the panel.

Figure 11:
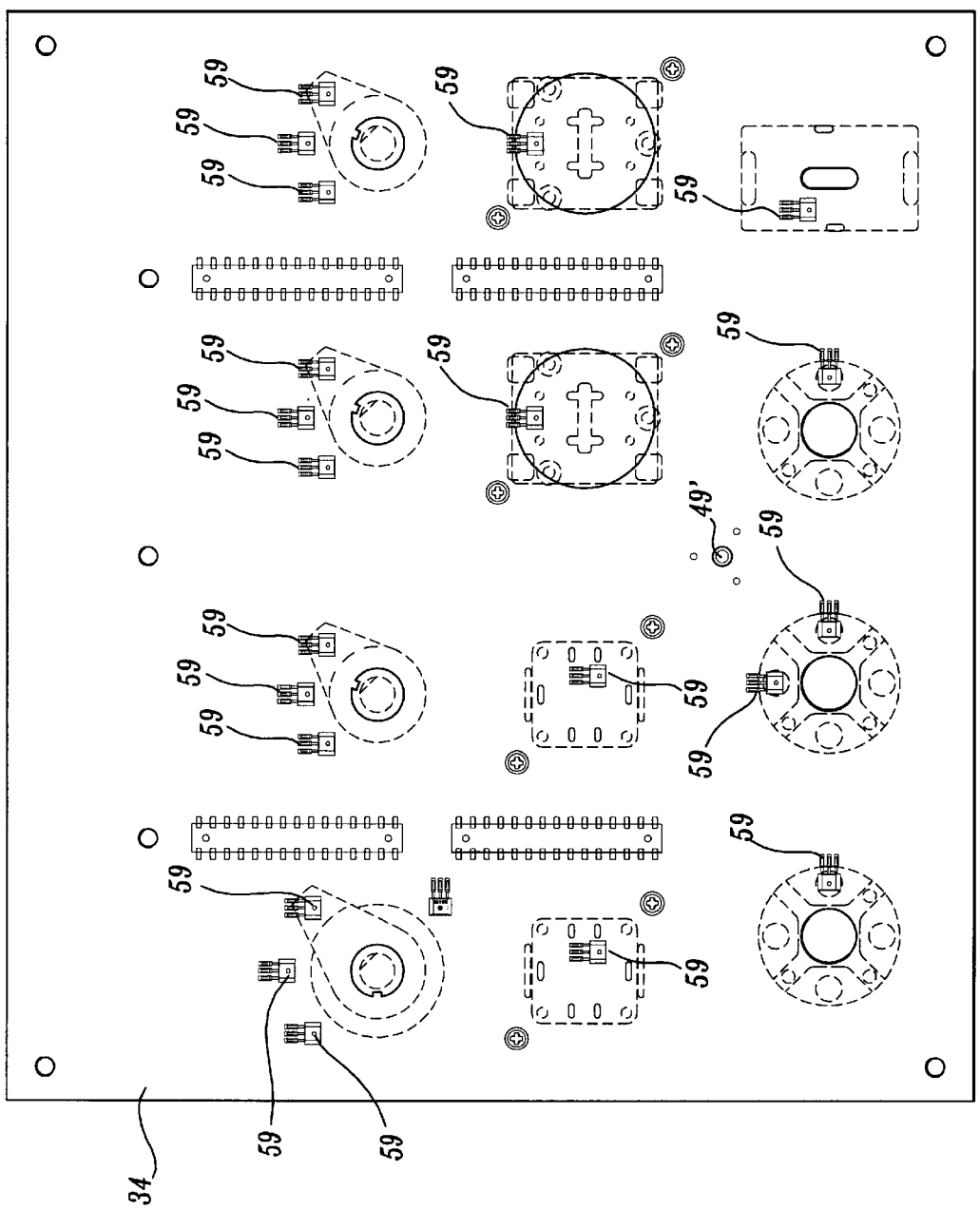
FIG. 11 is a rear elevation of another component of the module of FIG. 1, namely, a printed wiring assembly (PWA)

The rear of the front PWA 34 is shown diagrammatically in FIG. 11. FIG. 11 does not show the circuit traces, but does show the location of several Hall effect sensors 59 which cooperate with the switches used in the present invention as described below and the connector 49' (shown diagrammatically in FIG. 11 and described in detail below in connection with FIGS. 39–43) that mates with the light plate power connector. The broken lines indicate components of the switches which are described in detail below.

Figure 12:
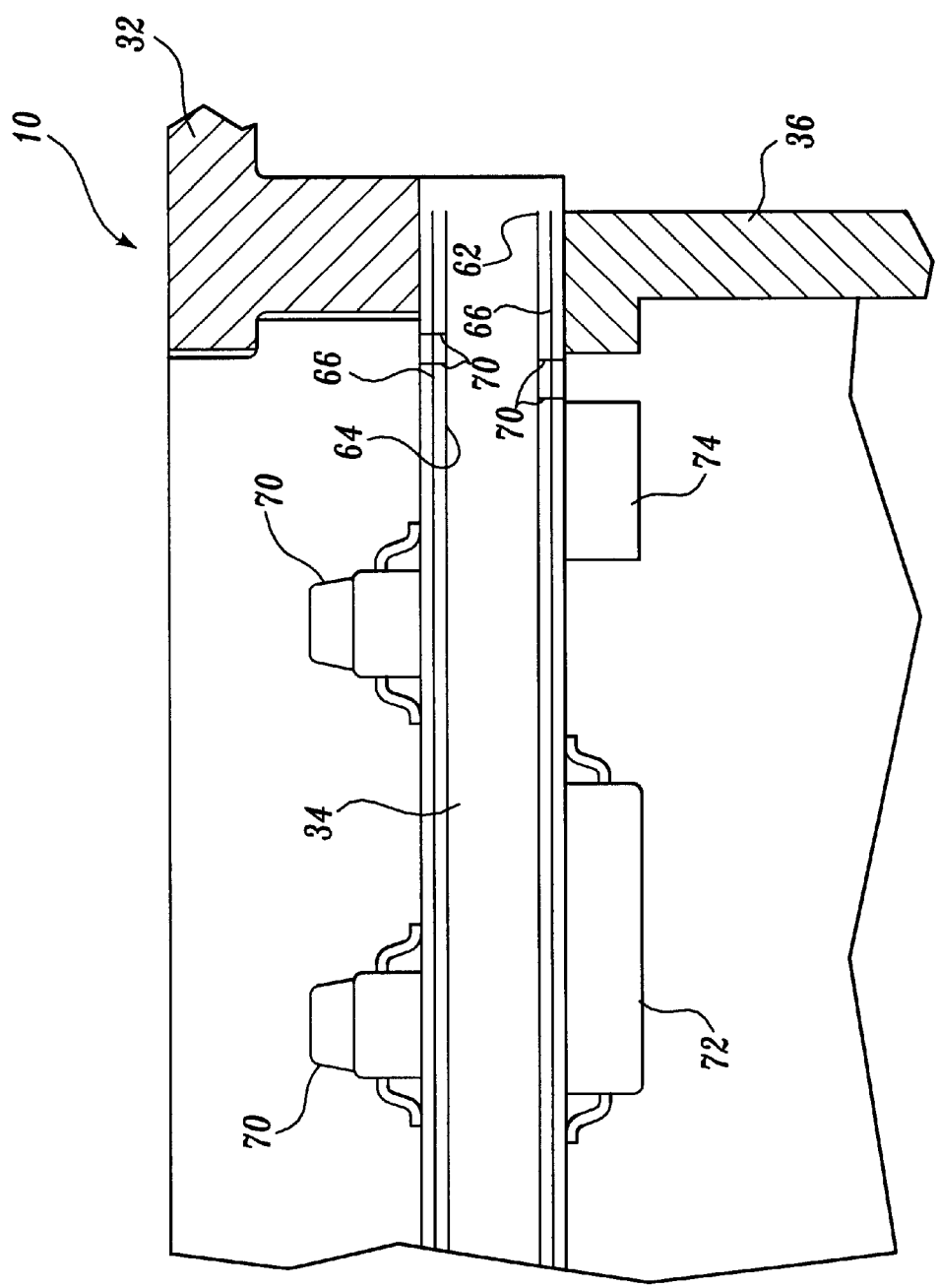
FIG. 12 is a somewhat diagrammatic enlarged, fragmentary side elevation of the module of FIG. 1 with parts broken away.

FIG. 12 is an enlarged diagrammatic view of a corner portion of the improved panel 10 in the area where the front PWA 34 contacts the machined front plate 32 and siderails 36. The wiring board has internal ground and power planes 62 and 64, respectively. In addition, a thermal plane, i.e., a thin sheet or film of heat conductive material, is provided just below each flat exterior surface of the wiring board 34. Copper flooded thermal vias 70 are provided to thermally couple a thermal plane 66 with the panel housing consisting of the front plate 32, side rails 36 and the rear cover, all of which are heat conductive, nonmagnetic material such as aluminum. In addition, surface copper (or other heat conductive material) is provided on the PWA in position to contact heat conductive portions of the housing. Heat conducting components of the panel, such as LEDs 70, voltage regulator 72, resistor 74, and any other heat generating components mounted on the PWA 34 can be thermally coupled to the adjacent thermal plane and/or surface copper for dissipating heat through the panel housing.

Thermal management for the heat generating components which are mounted on the PWAs present thermal design constraints not often found in other applications, including the following:

1) high ambient temperature environment with little or no air circulation (in excess of 60° C. on backside of panels);

2) touch temperature requirements—the front panel, control surface, operating levers and knobs, and case temperature rise above ambient cannot exceed certain limits;

3) a mix of low junction temperature parts with high power dissipating parts; more specifically, a low junction temperature is crucial to long life and high performance of LEDs used in annunciators and lighted switches, but drive circuitry for the LEDs, as well as solid state switches, can dissipate considerable power.

Given these thermal constraints, a thermal management method was developed which maintains the LED temperatures at a low level, and maintains front plate and light plate temperatures at a low level. In addition, LEDs and front plate components are isolated from heat generated by linear regulators, resistors and other circuitry mounted on the rear surface of a PWA. This is achieved by thermal isolation of front and rear sides of the PWA. Further, a key challenge is to remove a large amount of heat generated by all high power switches and heat generating components, both for the front PWA and the rear PWA.

For example, in a high power condition, 24 watts must be removed from the front PWA 34. This can represent a thermal density of about 0.5 watts per square inch, implying a temperature rise of 63° C. if nothing is done to improve dissipation. Of this, only 4 watts is dissipated on the front side, which contains the LEDs, the remainder of the power being dissipated on the rear side. To maintain long LED life and optimal performance, it is preferable to keep the LED temperature as low as is reasonable. While LEDs must be mounted on the front side of front PWA, higher temperature, higher dissipation components are mounted to the rear side. Thermal isolation between the front and rear sides is achieved by providing the buried thermal planes of, for example, 2-ounce copper (0.0028 inch thick), very closely adjacent to the external faces. Dielectric material of a thickness of about 0.005 inch is provided between each thermal plane and the adjacent front or rear surface containing the surface mount components, which assists in effectively spreading the heat through the PWA to the edges. Just beneath each thermal plane is another 2-ounce copper plane for electrical purposes (power and ground). The location of this plane further helps to spread the heat. The total thickness of the PWA is approximately 0.105 inch, with approximately 0.089 inch of a thermal isolating material such as glass epoxy between the electrical planes. This provides a significant amount of thermal isolation from one side of the board to the other.

Heat removal from the PWA is enhanced by the use of numerous copper flooded thermal vias 70 that are used to move heat from the near side thermal plane to faying surface copper on the exposed surfaces of the board. Such faying surface copper is located around the edges of the PWA, both the near and far sides, and at any other points where the PWA contacts the machined front plate. As seen in FIG. 12, the PWA 34 is squeezed between the machined front plate 32 and the side rails 36. Thus, the machined front plate removes heat from the front of the printed wiring board, most of which is spaced a uniform distance, such as 0.125 inch, from the rear of the front plate. The thick side panels and rear cover provide heat removal from the backside of the PWA, which contains the components generating the most heat.

Since the rear PWA is spaced a greater distance from the front PWA, two inches in a representative embodiment, and is not in direct thermal contact with the front plate, it may not be necessary to thermally isolate one side of the rear PWA from the other, although this feature could be implemented if needed. Presently it is believed that thermal management for the rear PWA can be accomplished by surface faying of highly heat conductive material such as copper in contact with housing components, mounting screws and the thermally conductive bases of the rear connectors 40.

Figure 13:
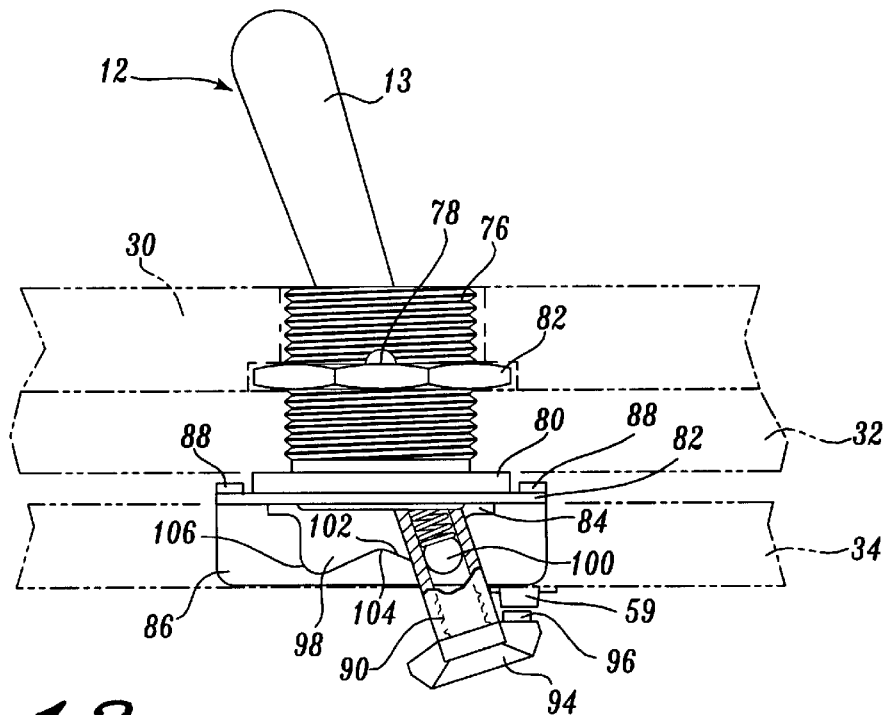
FIG. 13 is a diagrammatic side elevation of a toggle switch useable with a solid state flight deck module in accordance with the present invention, with parts broken away.
Figure 14:
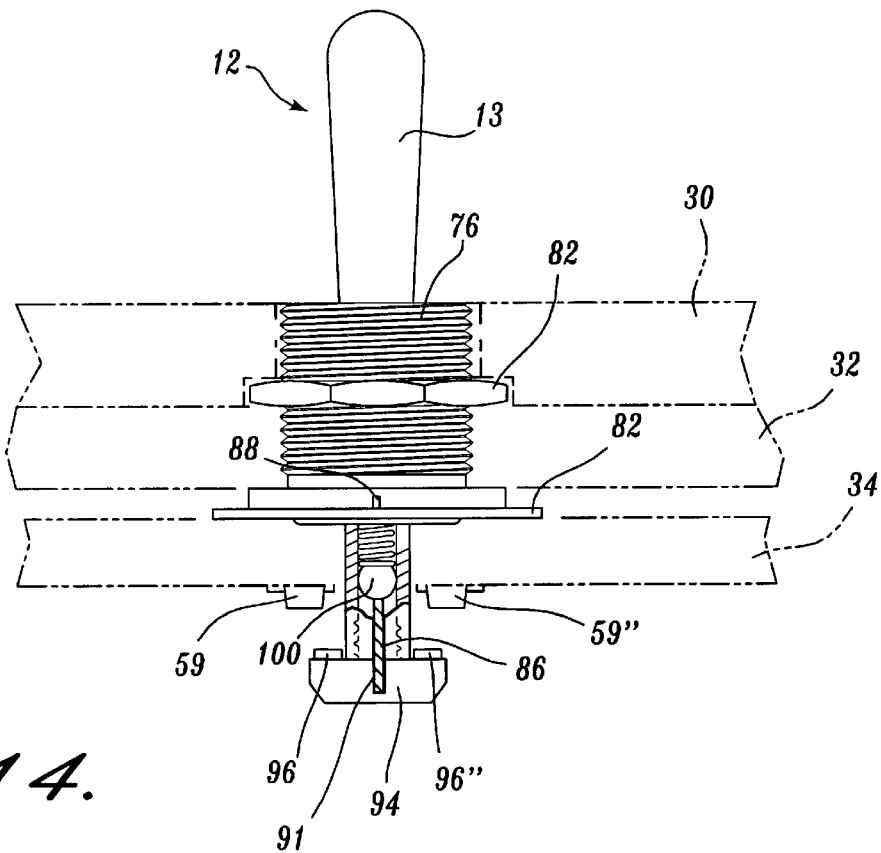
FIG. 14 is an end elevation thereof.
Figure 15:
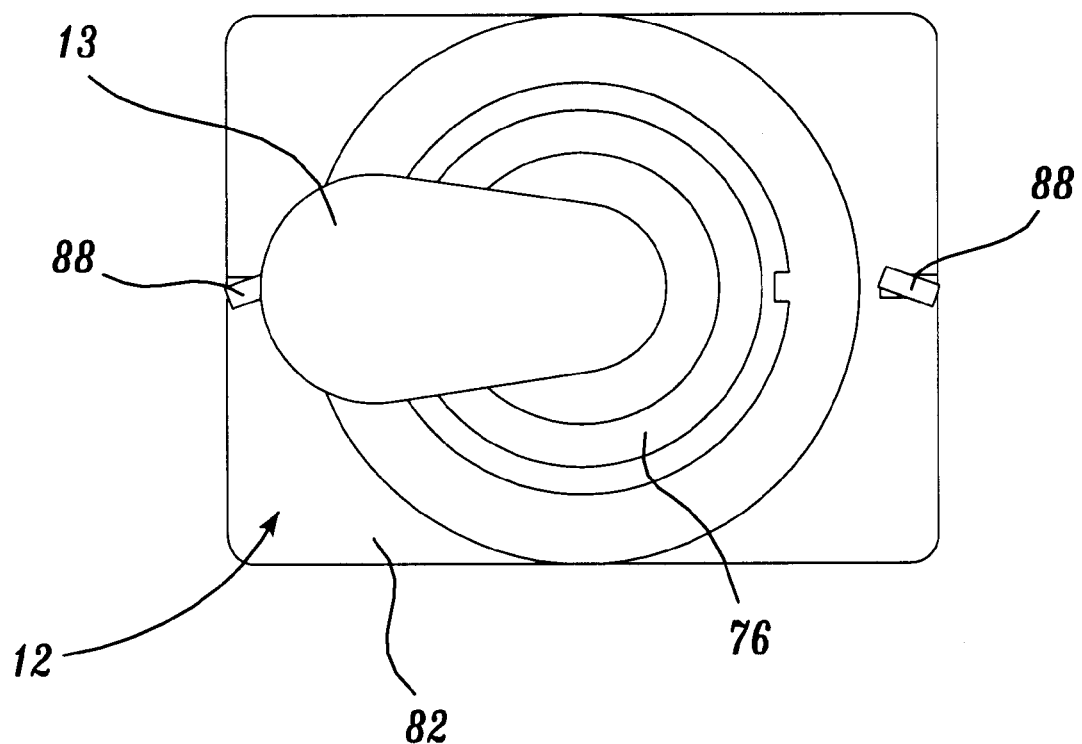
FIG. 15 is a front elevation thereof.

As noted above, all of the switching and indicator components of the improved systems control panel in accordance with the present invention are designed to be used with the standardized front plate, PWAs, and housing. With reference to FIGS. 13–15, in the case of a toggle switch 12, a switch lever 13 is pivoted to a hollow switch body 76 for swinging in a single plane about the axis of a pivot pin 78. The switch body 76 has an enlarged rear portion 80 for fitting against the rear face of the front plate 32. The body has external threads for a front mounting nut 82 which clamps the switch body in position. Preferably, the front end of the body 76 is approximately flush with the front face of the light plate 30. The enlargement 80 has a large, flat rear portion or flange 82. Together, the thickness of enlargement 80 and its rear flange 82 are no more than the desired spacing between the front plate 32 and the front PWA 34, i.e., 0.125 inch in the preferred embodiment. If the thickness of the enlargement is much less, separate standoffs are used to maintain the spacing. A thin cam plate 86 is mounted on the rear flange 84, such as by short twist tabs 88 that extend through corresponding slots or notches in the rear flange 84. The cam plate fits in a central slot 91 (FIG. 14) of the rear portion 90 of the operating lever 13 that extends rearward beyond the switch body 76. Thus, the rear end portion 90 of the operating lever 13 is bifurcated, with each bifurcation sliding along the cam plate 86 as the operating lever is swung about its pivot 78.

A magnet carrier 94 is secured to the rear end of the switch operating lever, behind the rear edge of the cam plate 86. One or more small magnets 96 are mounted on the magnet carrier such that, as the operating lever is moved, the magnets move toward and away from one or more Hall effect sensors 59 mounted on the rear surface of the front PWA 34. The number and location of the Hall effect sensors will depend on the different operating positions for the lever 13. In the embodiment illustrated in FIG. 14, it is desired to sense when the operating lever is in either of two positions, which can be accomplished by sensing whether magnets carried by the magnet carrier are in close proximity to a Hall effect sensor at one side or are located remote from the sensor. In most instances it is desired for one or more detent positions to be provided, so that the operating lever is biased to one or more positions from which it will not deviate unless moved manually by the user. In accordance with the present invention, the detent positions are determined by the shape of the central cutout 98 of the cam plate 86. A cam follower in the form of a spring loaded ball 100 mounted in a blind bore of the rear end portion 90 of the operating lever rides along the contoured rear edge of the cutout 98. In the embodiment illustrated in FIG. 13, a first detent position is achieved with the operating lever swung in one direction, in which the ball 100 rests in a first depression of the cutout 98. To swing the front or top end of the operating lever 13 to the right as viewed in FIG. 13, it is necessary to overcome the biasing force of the spring as the ball rides along the ramp 102 leading to the central cusp 104. After passing the cusp 104, the switch is biased positively toward the right until the ball 100 is received in the left depression 106 of the cam plate. As discussed in more detail below, the control circuitry need only detect whether the switch is in one position or the other, which is achieved by the output of the Hall effect sensor(s), indicating whether the magnet(s) 96 is/are close to or far from the sensor(s).

Figure 16A:
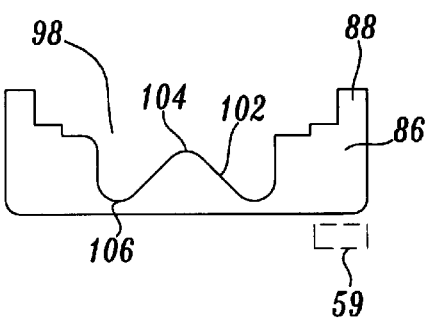
FIGS. 16A–16E are corresponding side elevations of components useable in the toggle switch of FIGS. 13–15.
Figure 16B:
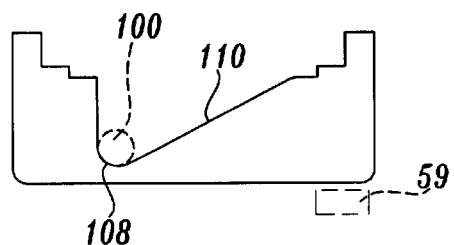
Figure 16C:
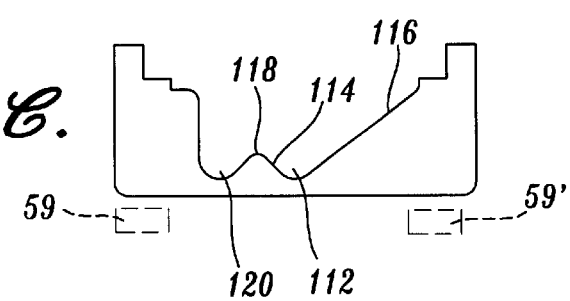
Figure 16D:
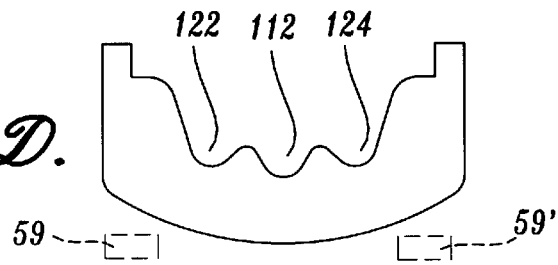
Figure 16E:
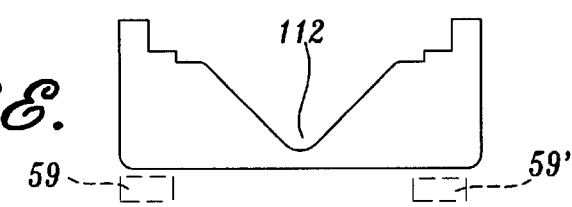

The cam plate 86 of FIG. 13 is shown removed from the rest of the components in FIG. 16A. Other configurations for the cam and its central cutout are shown in FIGS. 16B–16E. In the configuration of FIG. 16B, a single deep depression 108 is provided for biasing the operating lever to a position swung in one direction. From there the switch may be swung against the biasing force of the spring loaded ball as the ball moves along the ramp 110. However, when the switch lever is released, it will return to the position where the ball is received in the depression. In the configuration of FIG. 16C, a central depression 112 is provided for a central detent position. The lever can be moved against the biasing force of the spring loaded ball, with the ball moving along a short ramp 114 or long ramp 116. If moved along the short ramp 114, a short cusp 118 is reached, from which the lever is biased to a second, inclined detent position determined by a cam depression 120. Moving in the opposite direction, the switch lever can be moved away from the central position so that the ball moves up the long ramp 116 to the right, but when the switch lever is released, it will swing back to the central position. Thus, from the central position, the switch may be moved in one direction to a detent position, which can be detected by Hall effect sensors 59 mounted at that side, or it may be moved in the opposite direction, to be detected by Hall effect sensors 59' mounted at the opposite side, but only the central position and one of the swung positions is a stable detent position. FIG. 16D shows another configuration where the switch may be moved from a central detent position, defined by a cam depression 112, to either a rightward swung or leftward swung detent position, defined by depressions 122 and 124, and detected by. Hall effect sensors 59, 59' appropriately mounted at those sides. All three positions, center, right, and left, are detent positions. In the configuration of FIG. 16E, the only detent position is the central position, determined by cam depression 112, but the switch may be moved in either direction from that position, to be detected by Hall effect sensors 59, 59' appropriately mounted on the front PWA, and the switch lever will return to the central position when released.

Consequently, the "feel" and actuation of the toggle switch are controlled by a combination of the spring, ball and cam characteristics. To create multiple switch action configurations (such as momentary, three-position, etc.), requires only that the cam plate be replaced. All other components of the toggle switch can be used with any of the cam plates. While mounting to the front plate is illustrated in FIGS. 13–15 by use of a threaded body and nut, other mounting methods could be used, screws, adhesives, and so on. It is preferred, however, that normal and abnormal mechanical forces applied to the switch levers be transferred to the front plate rather than to a PWA. Application of force to the front PWA is avoided because the switch components may move close to the PWA in the open and closed positions, and during travel between the positions, but do not physically contact the PWA.

Another consideration is that magnetic emissions from flight deck equipment must be limited so as not to cause deflection of the pilot's magnetic compass or otherwise affect sensitive equipment. A large number of Hall effect sensors will be used on solid state flight deck modules in accordance with the present invention. While the magnets used with these Hall effect sensors individually are very small and have low magnetic field strength, when used in sufficient quantities the vector sum of their magnetic fields may exceed specifications for the maximum allowable magnetic emissions. Field cancellation can be achieved by orienting half the total number of magnets in each panel in the opposite direction to the other half (half having exposed north poles and half having exposed south poles) forcing the total magnetic field to be near zero. Where possible, field cancellation is implemented at the device level, that is, a device with two magnets will have one of them oriented in one direction and one in the other, and a device with four magnets will have two of them oriented in one direction and two in the other. Thus, it is preferred that switching components use magnet pairs oppositely oriented. For example, magnet carriers for toggle switches can have magnets 96, 96" at opposite sides of the central cam plate, as seen in FIG. 14, for example, coacting with Hall effect sensors 59, 59" at the appropriate sensing locations.

Figure 17:
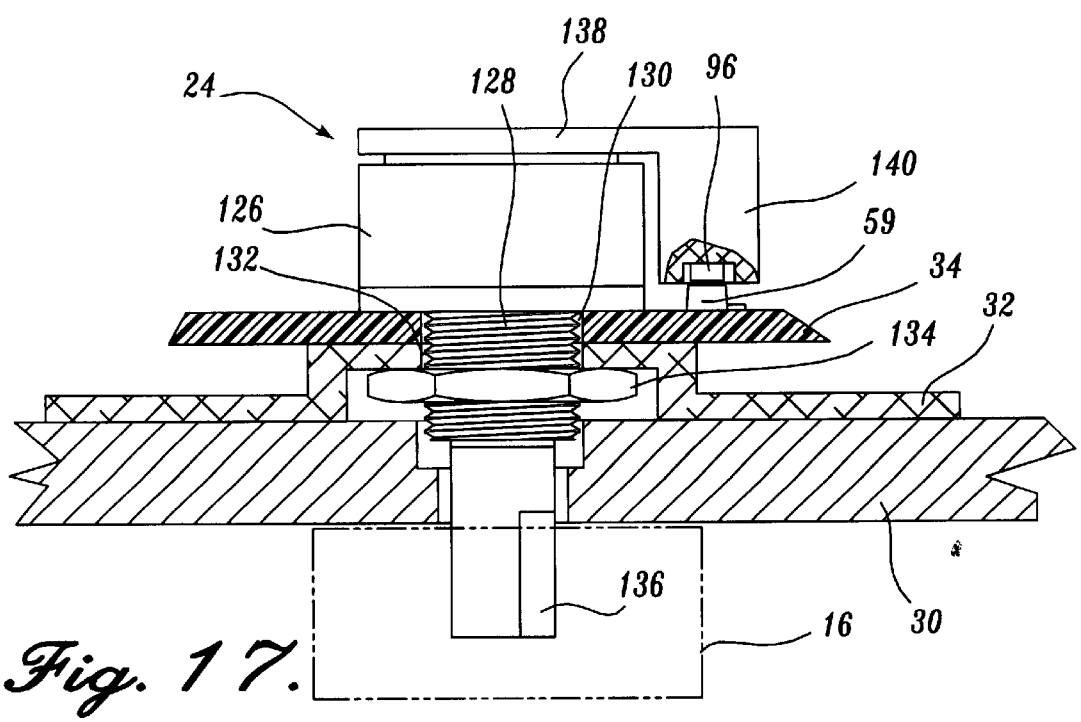
FIG. 17 is a side elevation of a rotary switch useable in a solid state flight deck module in accordance with the present invention, with parts broken away.
Figure 18:
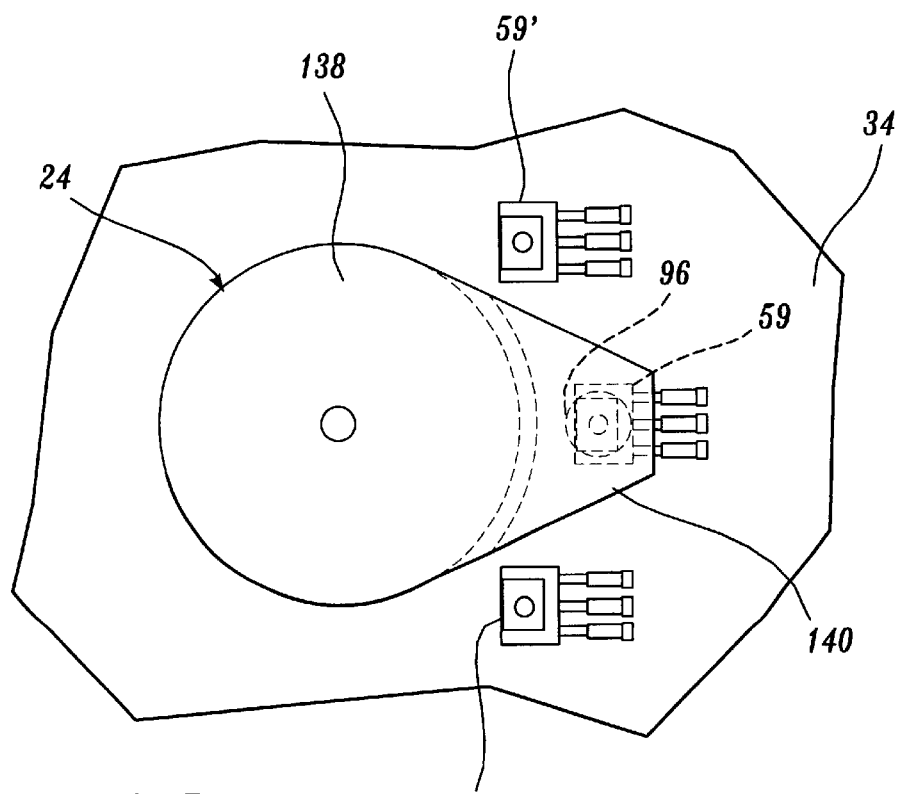
FIG. 18 is a somewhat diagrammatic rear elevation thereof.

FIGS. 17 and 18 show a rotary switch 24 that can be used in a solid state systems control panel in accordance with the present invention. The switch body 126 includes a threaded stem 128 extending through aligned holes 130 and 132 of the front PWA 34 and machined front plate 32. The rear portion of the body 126 is cylindrical, and of a diameter substantially greater than the stem 128 and the holes 130, 132 through which the stem extends. A front mounting nut 134 holds the switch body in position. An operating shaft 136 extends from inside the switch body and projects from the light plate 30 for attachment of the rotary operating knob 25. Rotation of the knob causes corresponding rotation of a rear magnet carrier 138. The magnet carrier includes a portion 140 extending forward, alongside the rear portion of the switch body 126, with a small magnet 96 at its forward end. Magnet 96 is positioned to pass close to one or more Hall effect sensors 59 mounted on the rear surface of the front PWA 34. By turning the operating knob 25, the rear magnet carrier 138, 140 is rotated to position the magnet 96 close to or remote from a Hall effect sensor 59.

Angular positions of the switch knobs 25, shaft 136 and magnet carrier 138, 140 are differentiated by a rotary detent mechanism within the rear portion of the switch body 126. Such detent mechanism can be identical to internal detents used for existing mechanical rotary switches, such as rotary switches available from Cole Instrument Corporation of Santa Ana, Calif., for example. The number of active positions per switch position is determined by the number of magnets carried by the magnet carrier. FIG. 18 illustrates a rotary switch mechanism having three active positions determined by proximity of the magnet 96 of the magnet carrier 138, 140 to three Hall effect sensors 59, 59' and 59", mounted on the front PWA 34 in an arc traversed by magnet 96 as the actuating knob is turned. The invention may be easily extended to provide multiple poles, or multiple independent switches in one assembly by use of concentric shafts and magnet carriers.

Figure 19:
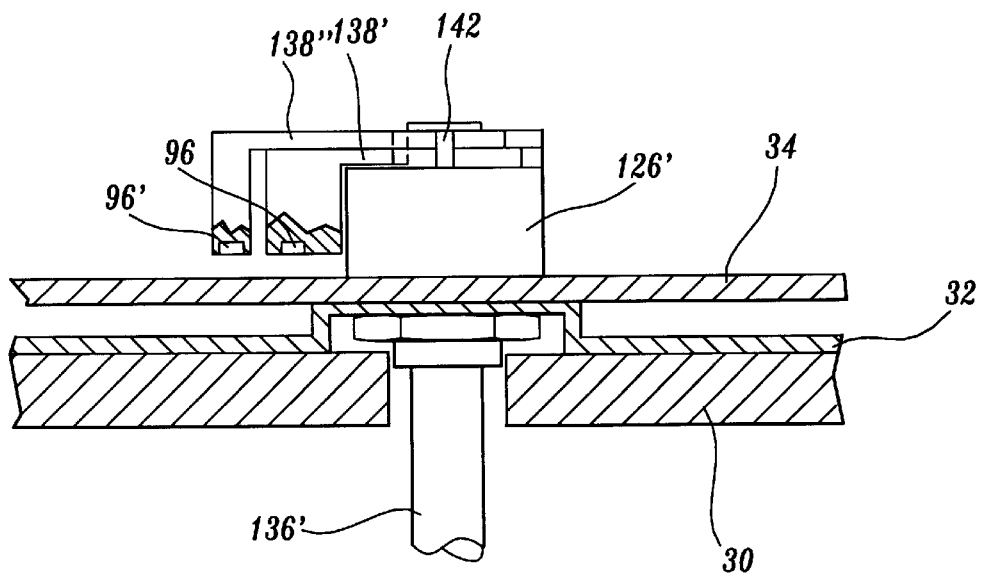
FIG. 19 is a side elevation of another rotary switch useable in a solid state flight deck module in accordance with the present invention, with parts broken away.
Figure 20:
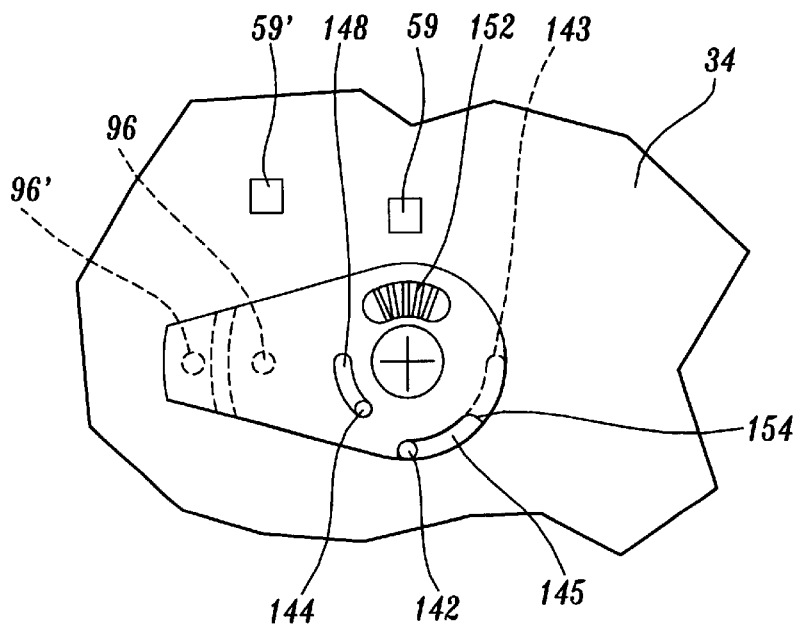
FIG. 20 is a somewhat diagrammatic rear elevation thereof.

For example, FIG. 19 and FIG. 20 show a conceptual design of a momentary-shorting switch, similar to the ignition-starting switch in an automobile. Shaft 136' is keyed to a first magnet carrier 138' that underlies a second magnet carrier 138" which is not keyed to the shaft. The switch body 126' has a rearward projecting peg 142. Such peg is received in a long arcuate slot 143 of the forward (bottom) carrier 138' and a shorter slot 145 of the rearward (top) carrier 138". The two carriers are biased for equal movement, such as by a spring 152. Carrier 138" is of a larger radius than carrier 138', so that the magnet 96' carried by carrier 138" is located farther from the axis of rotation than the magnet 96 carried by the inner carrier 138. Spring 152 engaged between the two carriers biases them to a position in which the magnets are approximately aligned radially, limited by a peg 144 projecting rearward from carrier 138' and engaging one end of an arcuate slot 148 of the rear carrier 138".

When the operating shaft 136' is rotated clockwise as viewed in FIG. 20, both magnet carriers swing together to a first "on" position in which the outer magnet 96' is in close proximity to Hall effect sensor 59' mounted on the front PWA 34. At this point, the stationary peg 142 engages the rear end 154 of slot 145 and prevents the top magnet carrier 138" from additional rotation. As the shaft 136" continues to rotate, only the other magnet carrier 138' will move with it, to a "start" position in which its magnet 96 is registered with the corresponding Hall effect sensor 59 on the PWA. Thus, an output signal is created in one sensor when the switch shaft is moved to a first on position, and an output signal is provided in the other sensor when the switch shaft is moved farther to another on position (referred to as the "start" position). A spring return is provided from the start position to the on position, and a mechanical detent within the switch body 126 retains the switch components in the on position until the switch is moved manually counterclockwise to the off position in which neither magnet is close enough to its associated sensor to activate the circuitry.

Figure 21:
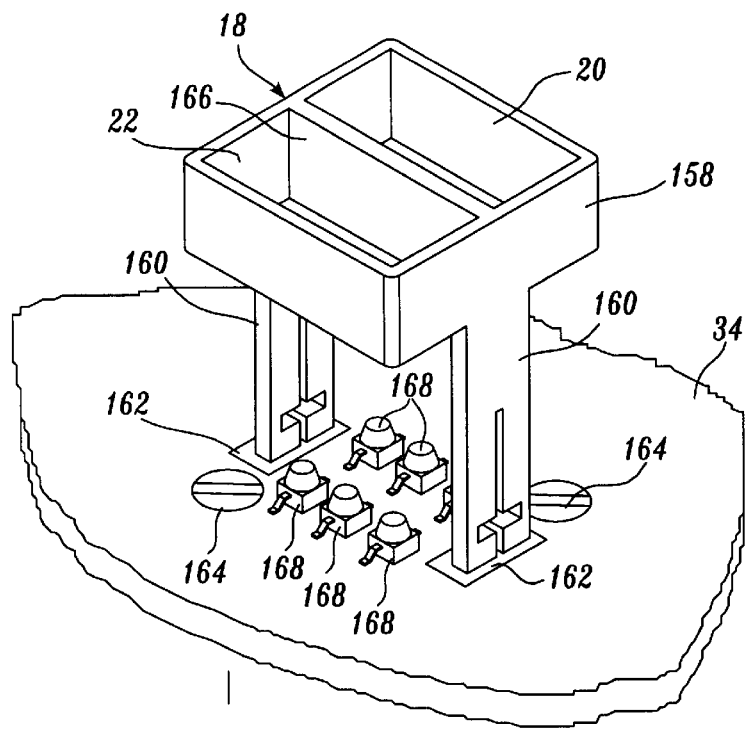
FIG. 21 is a top front perspective of component parts of a push button switch useable in a solid state flight deck module in accordance with the present invention.
Figure 23:
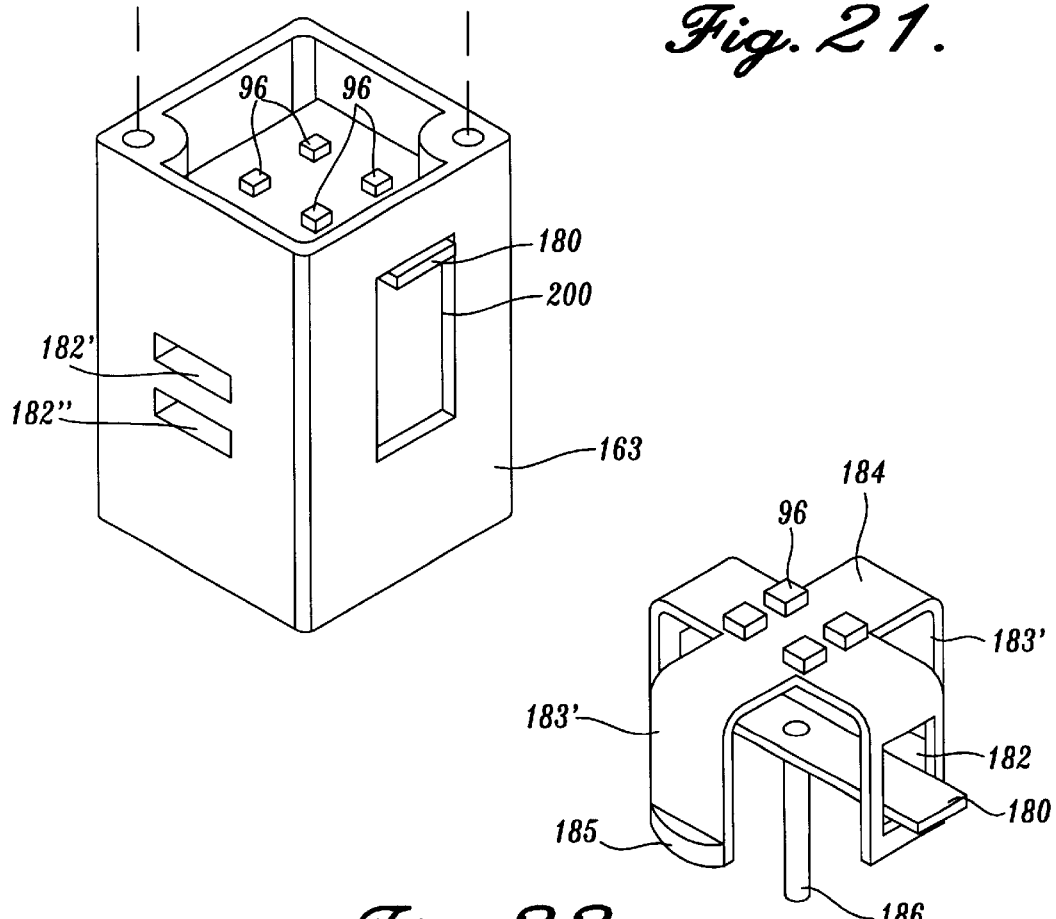
FIG. 23 is a top front perspective of another component of such push button switch, namely, a magnet carrier and actuator bar.
Figure 22C:
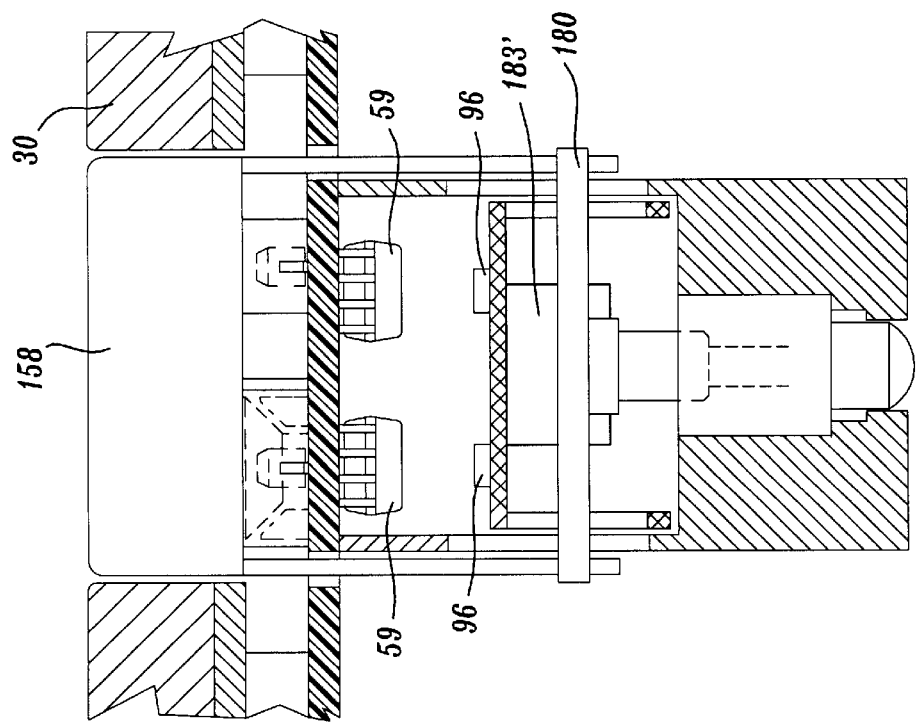
Figure 22D:
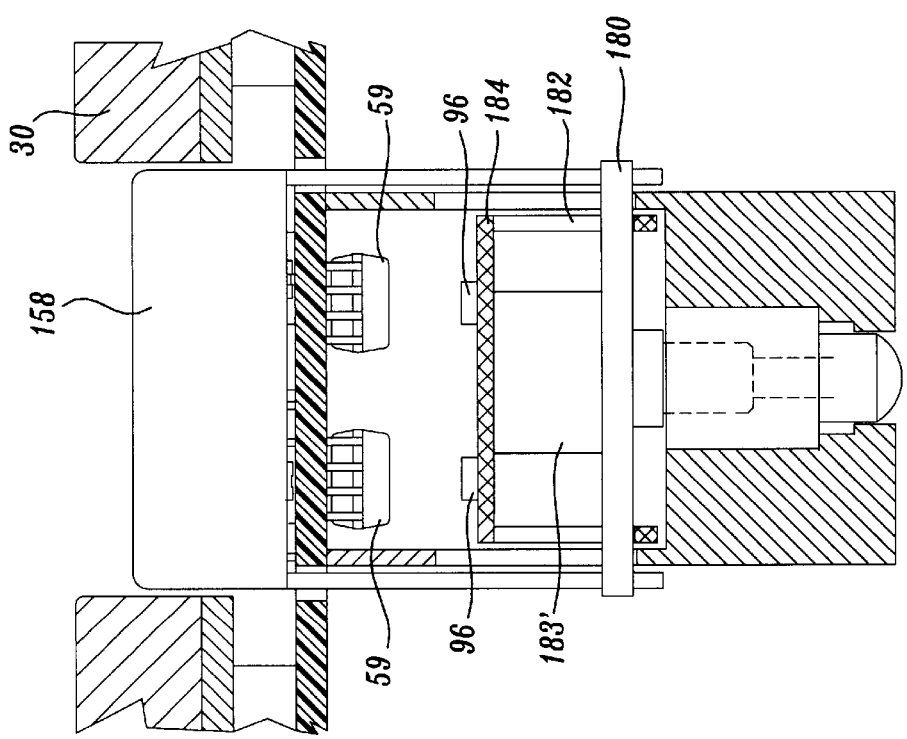

FIGS. 21–23 illustrate a push button switch 18 that may be incorporated in a solid state flight deck module 10 in accordance with the present invention. As previously described, and as seen in FIGS. 22A–22D, the module includes the front light plate 30, machined front mounting plate 32 and front PWA 34. Standoffs 156 are provided to achieve the desired spacing between the machined front plate 32 and front PWA 34. With reference to FIG. 21, the switch button 158 includes parallel, rearward extending legs 160 slideable in slots 162 of the front PWA 34. A switch body 163 is secured to the rear face of the PWA 34, such as by mounting screws 164. With reference to FIG. 22A, the two compartments 20 and 22 of the switch button are separated from each other by a center divider 166. LEDs 168 for the separate compartments are mounted on the front face of the PWA 34. Circuitry for actuating the LEDs resides in the PWA, preferably with heat producing components mounted on the rear face. In compartment 22, the LEDs are surrounded by a shroud 170 to prevent light from leaking into the adjacent compartment. Similarly, in compartment 20, the LEDs are enclosed within a telescoping housing assembly 172 which, when the button is depressed, opens a shutter assembly 174. The shutter assembly and its actuating mechanism are conventional and therefore are not further described herein. At the front side of the button, lenses 176 with desired indicia can be provided.

The rear end portions 178 of the switch legs 160 carry an actuator cross bar 180. With reference to FIG. 23, bar 180 has its opposite ends received in elongated slots 182 of fore and aft extending fingers 183 of a carrier 184 for an array of magnets 96. Thus, the switch button and bar 180 are moveable relative to the magnet carrier, as limited by the length of the slots 182. The carrier 184 also has two rearward extending latch fingers 183' each having a latching projection or lug 185 on its rear end portion. Lugs 185 cooperate with latch slots 182' and 182" (FIG. 21) of the switch body 163 to retain the carrier in alternate forward or rearward shifted positions.

A detent actuating rod 186 extends rearward from the cross bar 180 and cooperates with a conventional dual position detent mechanism 188, shown diagrammatically in FIGS. 22A–22D. Various types of dual detents can be used and, therefore, the detent assembly is shown diagrammatically. However, unique to the present invention is the mechanism for controlling the travel of the magnet carrier 184 to position the magnets 96 either close to the PWA mounted Hall effect sensors 59 or at a position remote from the sensors.

Operation of the push button switch of FIGS. 21–23 is as follows: the detent mechanism 188 has an internal spring biasing the shaft 186 forward. In the "off" projected position shown in FIG. 22A, shaft 186 is biased to move the cross bar 180 forward in the magnet carrier slots 182 and in corresponding slots 200 of the switch housing 163. In this position the latch lugs 185 engage in the forward latch slots 182'. If the button 158 is depressed to a position in which its front face is flush with the front face of the light plate 30, shown in FIG. 22B, bar 180 is moved approximately to the rear ends of slots 182, and if the button is then released it will return to the projected position shown in FIG. 22A without having moved the magnet carrier 184. If, however, the button is pushed farther inward to the position of FIG. 22C, for deliberate actuation of the switch, the cross bar 180 seats in the rear ends of slots 182 and moves the magnet carrier rearward. A rear detent position is reached in which the latch lugs 185 engage in the rear latch slots 182" such that the switch button and magnet carrier are retained in an inward or rearward shifted position, with the magnets sufficiently far from the PWA mounted sensors 59 for detecting actuation of the switch button, despite the button moving to the position of FIG. 22D in which the front surface of the button 158 is approximately aligned with the front face of the light plate 30. The detent can be released and the switch button and magnet carrier returned to the position of FIG. 22A by pressing the button inward to approximately the position of FIG. 22C, followed by releasing the button for travel forward or outward, carrying with it the cross bar 180 and shifting the magnet carrier forward to position the magnets 96 closely adjacent to the Hall effect sensors 59.

The push button switch described above uses an alternate action (i.e., push on, push off) detent mechanism. Alternatively, it may be configured as a non-latching mechanism to implement a momentary type switch. In that case, the magnet carrier can be positively keyed to the push button, or may be configured to move after the push button has been moved a predetermined distance, to be returned to the start position when the button is released.

Figure 24:
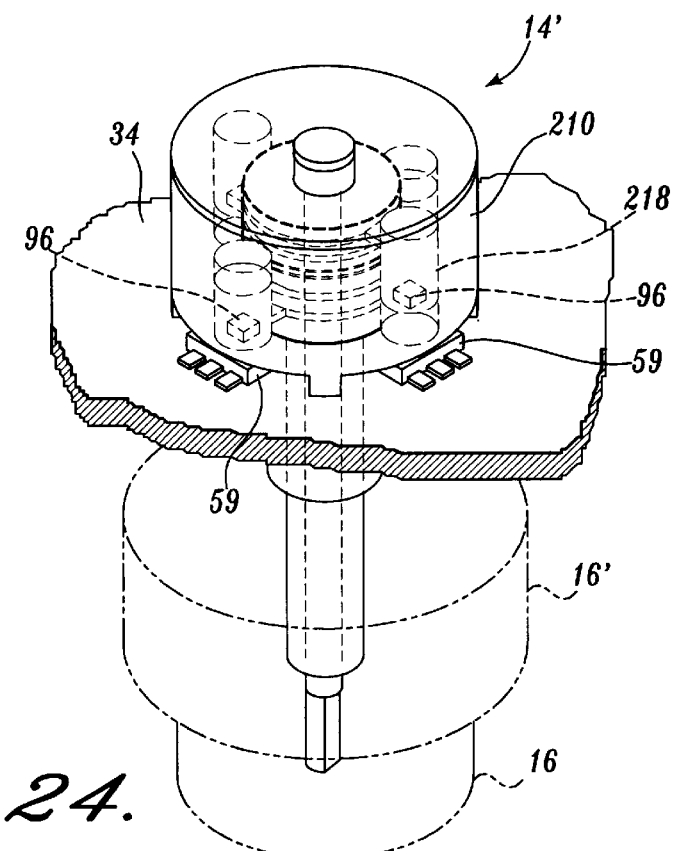
FIG. 24 is a top rear perspective of a rheostat useable in a solid state flight deck module in accordance with the present invention, with parts broken away.
Figure 25:
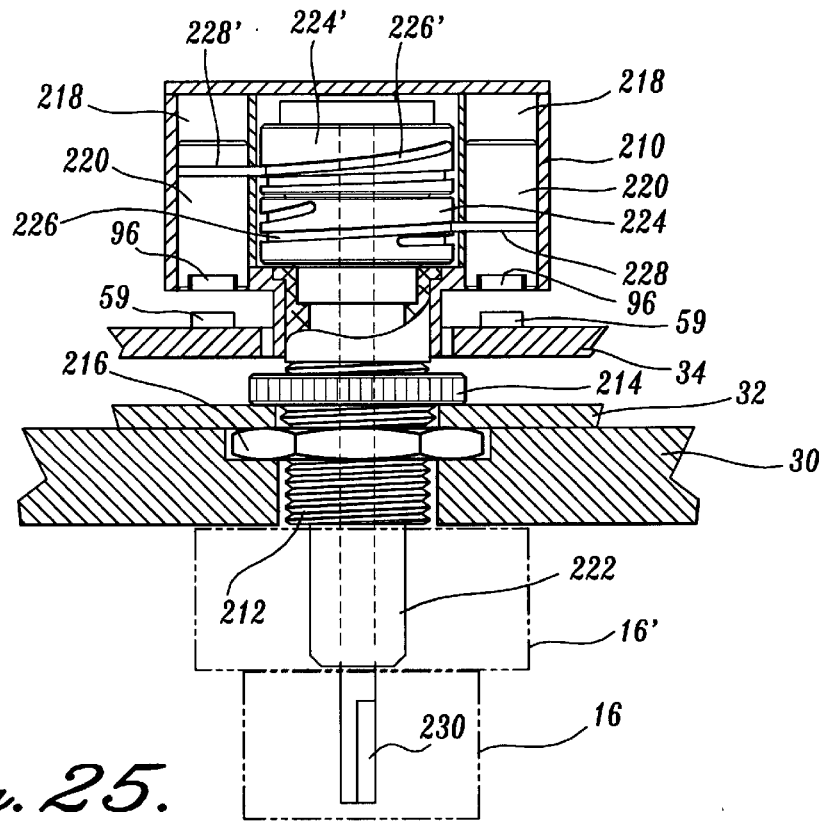
FIG. 25 is a side elevation thereof with parts broken away.

With reference to FIGS. 24 and 25, a rheostat 14' can be implemented by mounting Hall effect sensors 59 on the rear surface of the PWA 34, with mechanism in the switch body 210 for moving permanent magnets 96 toward and away from the Hall effect sensors depending on the degree of rotation of operating knobs 16 and 16'. As seen in FIG. 25, the rheostat body 210 includes a threaded stem 212 for a spacer nut 214 at the rear side of the mounting plate 32 and a front mounting nut 216 at the front side of the plate. This assembly maintains the rheostat body 210 in a fixed position relative to the machined front plate 32 and front PWA 34. The spacing between plate 32 and PWA 34 is the desired uniform distance, such as 0.125 inch.

The rheostat body 210 includes one or more cylinders 218, each of which slideably receives a piston member 220. Each piston member has a permanent magnet 96 in line with a Hall effect sensor 59 mounted on the rear side of PWA 34. In general, turning of the operating knobs 16, 16' moves the pistons 220 in their cylinders 218 and adjusts the distance between the magnets 96 and Hall effect sensors 59. The outputs of the Hall effect sensors are functions of the distances between the magnets and the sensors, and therefore indicate the positions of the operating knobs.

More specifically, one of the operating knobs 16' is keyed to a shaft 222 extending through the light plate 30, and the stem 212 of the rheostat to a front cam disk 224 which rotates with shaft 222. The cam disk 224 has a helical cam slot 226. A transversely extending peg 228 from one of the pistons 220 rides in the helical cam slot 226. Thus, by turning knob 16, shaft 222 and disk 224 are turned, and the position of the piston is determined by the changing location of the portion of the cam slot 226 in which the piston peg 228 rides. A greater or lesser degree of travel of the piston for a given amount of rotation of knob 16 can be predetermined by the angle or slope of the cam slot 226.

In the embodiment illustrated in FIG. 25, a second operating knob 16 is keyed to an inner shaft 230 which extends through a hollow central bore of shaft 222 to a rear cam disk 224'. Disk 224' has a helical cam slot 226' which receives the inner end portion of a transversely extending peg 228' of another of the pistons 220. Thus, the position of piston 220 and its magnet 96 relative to the corresponding sensor 59 is determined by the rotational position of knob 16.

Although FIG. 25 shows two pistons at diametrically opposed locations, one controlled by knob 16 and the other by knob 16', in the preferred embodiment diametrically opposed pistons would be moved together by having pegs positioned in portions of the cam slot 226 at opposite sides of the cam disk 224. Similarly, the other two pistons would be located diametrically opposed from each other and controlled by rotation of knob 16' and the rear cam disk 224'. The pistons controlled by one knob would be located 90° from the pistons controlled by the other knob.

Figure 26:
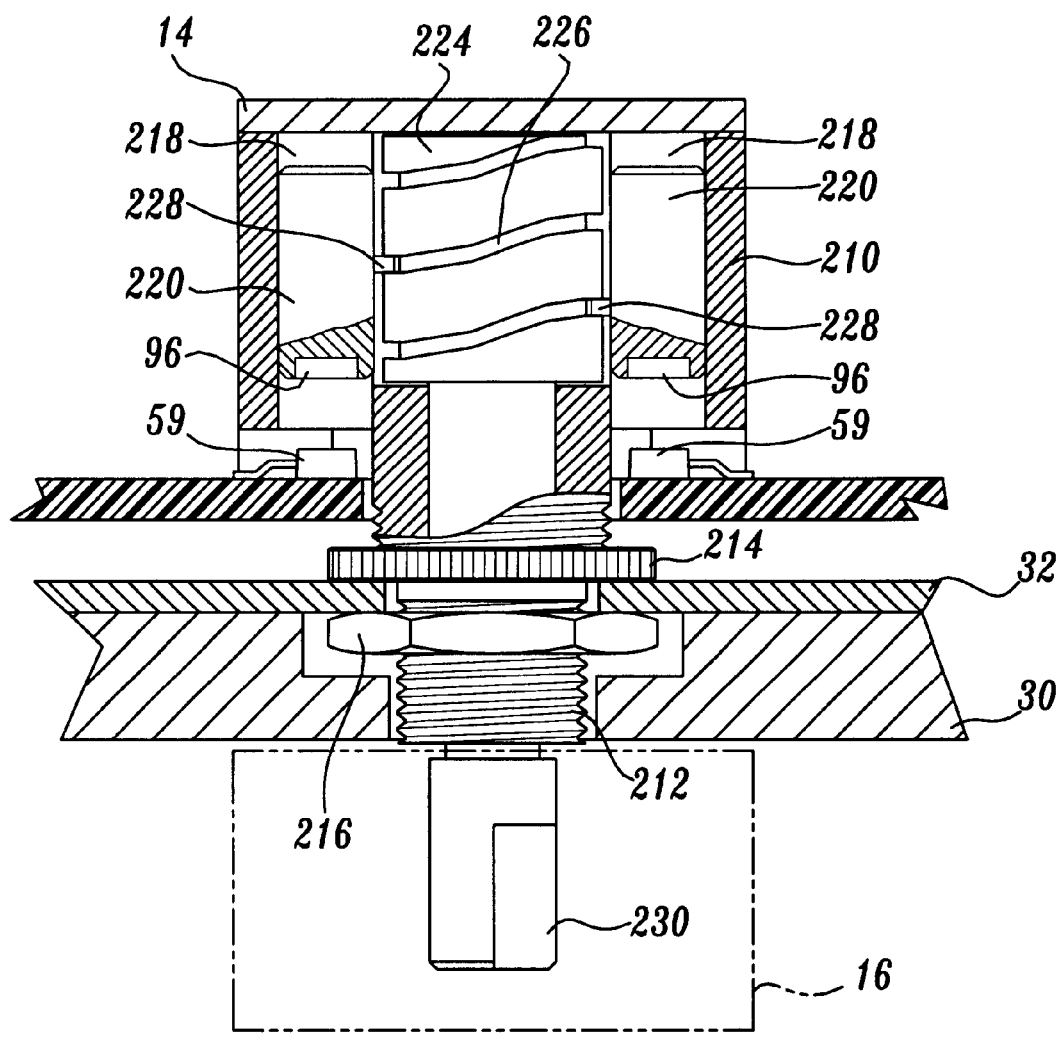
FIG. 26 is a side elevation of an alternative rheostat useable in a solid state flight deck module in accordance with the present invention, with parts broken away.

FIG. 26 shows a similar rheostat 14 having a single control knob 16 controlling a single shaft 230. Shaft 230 extends through the threaded stem 212 of the rheostat housing 210 which has cylinders 218 for slideable pistons 220. The housing 210 is mounted on the machined front plate 32 by a rear spacer nut 214 and front mounting nut 216. Shaft 230 controls rotation of a single cam disk 224 having a generally helical cam groove 226. Pistons 220 have one or more transversely extending pegs 228 with inner portions received in the groove 226. Consequently, rotation of the knob 16 causes a corresponding rotation of shaft 230 and cam disk 224, such that the pistons 220 are slid in the cylinders 218 to position permanent magnets 96 mounted at the front ends of the pistons closer to or farther from Hall effect sensors 59.

Figure 27:
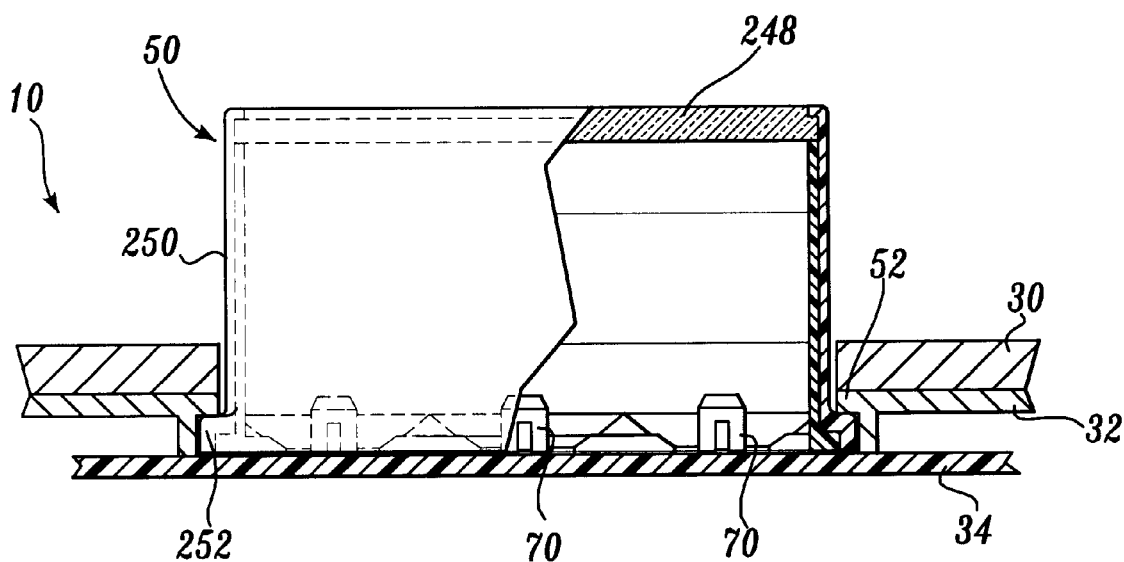
FIG. 27 is a side elevation of part of a solid state flight deck module in accordance with the present invention, with parts broken away, illustrating an annunciator useable in the invention.

With reference to FIGS. 27–29, annunciator assemblies 26 in the solid state flight deck module 10 in accordance with the present invention use LEDs 70 mounted on the front face of the front PWA 34. For each annunciator, preferably a plurality of LEDs are used, three LEDs being used for each annunciator in the preferred embodiment. The LEDs project into specialized annunciator housings formed of multiple pieces. With reference to FIG. 28, the innermost parts of the housings are specialized reflectors 238 manufactured from or having their internal surfaces coated with a highly reflective material. Each reflector is formed by halves 240 which are mirror images of each other. Each half 240 has a base portion 242 with three generally semi-circular cutouts 244 such that, when the halves are brought together, three openings 246 are formed for the LEDs to project into the housing. A special lens 248 fits on the front or outer edges of the reflector halves 240. A unitary cap 250 is slid over the lens and reflector halves. The base of the cap 250 has a peripheral rim or lip 252 which, as seen in FIG. 27, fits against a shoulder 52 of the machined front plate 32. The front PWA fits against the base of the cap 252, with the LEDs 70 projecting into the interior. The adjacent faces of the front PWA 34 and front machined plate are maintained at the desired uniform distance from each other so as to be compatible with the other components of the panel.

The lens 248 and composite reflector 238 control the light emitted from the LEDs. The specific shape of the reflector is influenced by a combination of performance, cost, and overall ease of assembly. Light from each LED is emitted generally in all directions. Frustoconical sockets 254 around the openings for the LEDs assist in reflecting rearward directed light outward toward the annunciator lens. The walls 256 of the reflectors are specially shaped for achieving a high degree of readability of the legend incorporated in the annunciator lens. As best seen in FIG. 30, such walls consist of a central portion 260 lying in a plane approximately perpendicular to the PWA. A shorter inner section 262 forms an angle of approximately +6° with the center portion, and a short outer portion 264 forms an angle of approximately −6° with the center portion. Maximum light transmission has been achieved by coating the entire interior of the reflector with a high efficiency aluminum reflective coating. The three sections of the annunciator walls approximate a parabola, and have a surprising effect on the readability of the lens legend, particularly at side angles up to 70°. In most reflector applications, the reflector shape gets larger as it gets closer to the exit surface. For example, such is the case with a parabolic headlight reflector where the light source is positioned at the focus, and the light is reflected at smaller and smaller angles off the surface as the light travels farther away from the light source. This results in a focused light output. In the present invention, a wide angle dispersed light output is achieved by making the reflecting surface smaller as the light travels toward the exit end of the reflector. This causes the light to leave the cavity at larger angles relative to the exiting surface.

Figure 31:
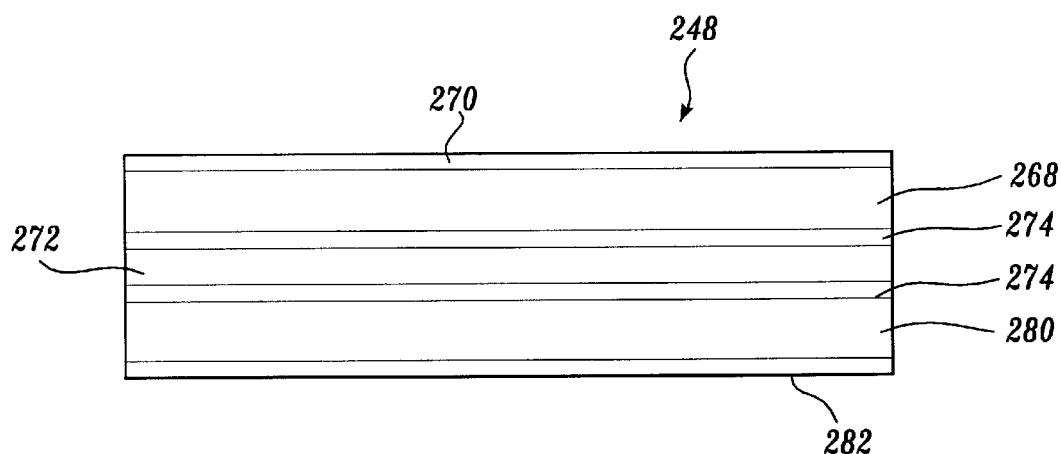
FIG. 31 is an end elevation of another component of the annunciator, namely, the annunciator lens.

With reference to FIG. 31, the lens 248 also is a new design to achieve improved contrast as compared to known designs. In the present invention, lens 248 includes an upper layer 268 of neutral density attenuating material, such as Lexan of a thickness of about 0.015 inch thick. The outer surface of this layer is treated with a UV stable coating 270 such as the coating used for a keyboard overlay which produces both a hidden legend appearance when the display is not illuminated and provides chemical resistance to most common solvents. Next, a legend layer 272 is provided consisting of a photographic emulsion in which the legend indicia is produced and then is bonded behind the neutral density filter, such bonds being represented as thin layers 274 in FIG. 31. A clear sheet 280 of thin (0.020 inch) strength-reinforcing material such as 8010 Lexan is then bonded to the photographic emulsion film layer. The inside surface of the strength layer is also treated with UV stable hard coating 282. The coating on the surface which faces the reflectors allows more of the light which impinges on the lens at larger angles relative to normal to enter the lens rather than be reflected back toward the light source. Overall, the current preferred embodiment of the lens provides a transmission of 25–30% in the green and yellow spectrum while attenuating the light in the red and blue spectrum to less than 15%. Preferably, the annunciator is used with LEDs producing light in the yellow-green spectrum. By selection of a different transmission neutral density material, the concept can be applied to all visible colors.

Figure 32:
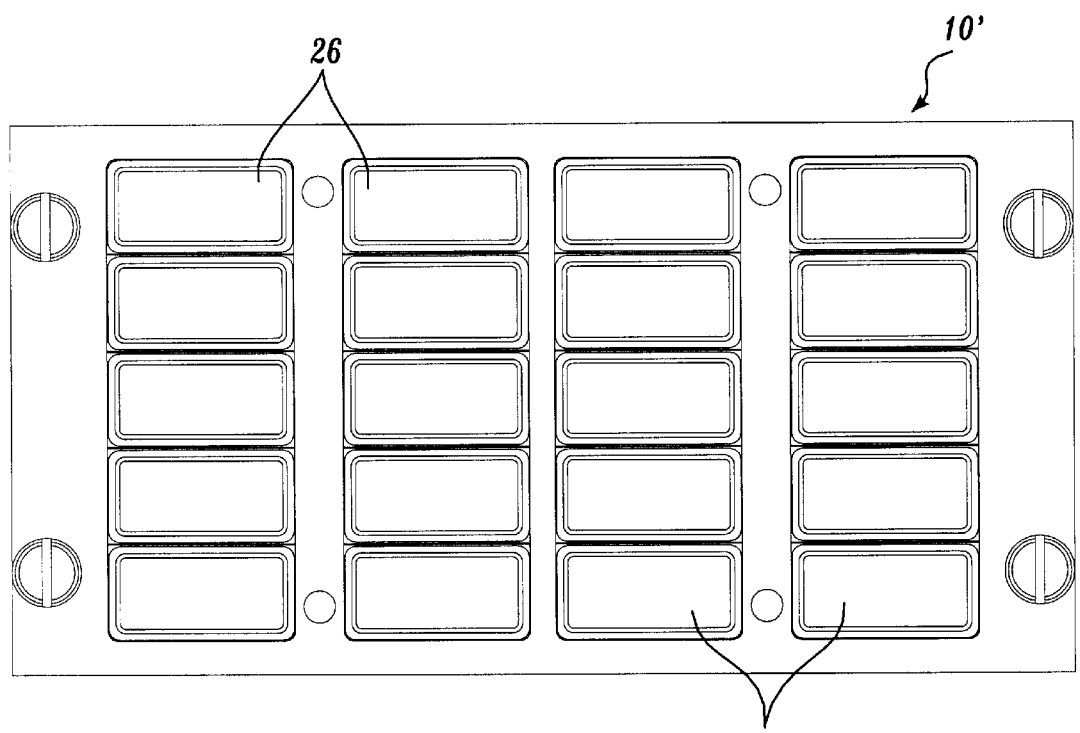
FIG. 32 is a front elevation of a solid state flight deck module in accordance with the present invention comprising banks of annunciators.
Figure 33:
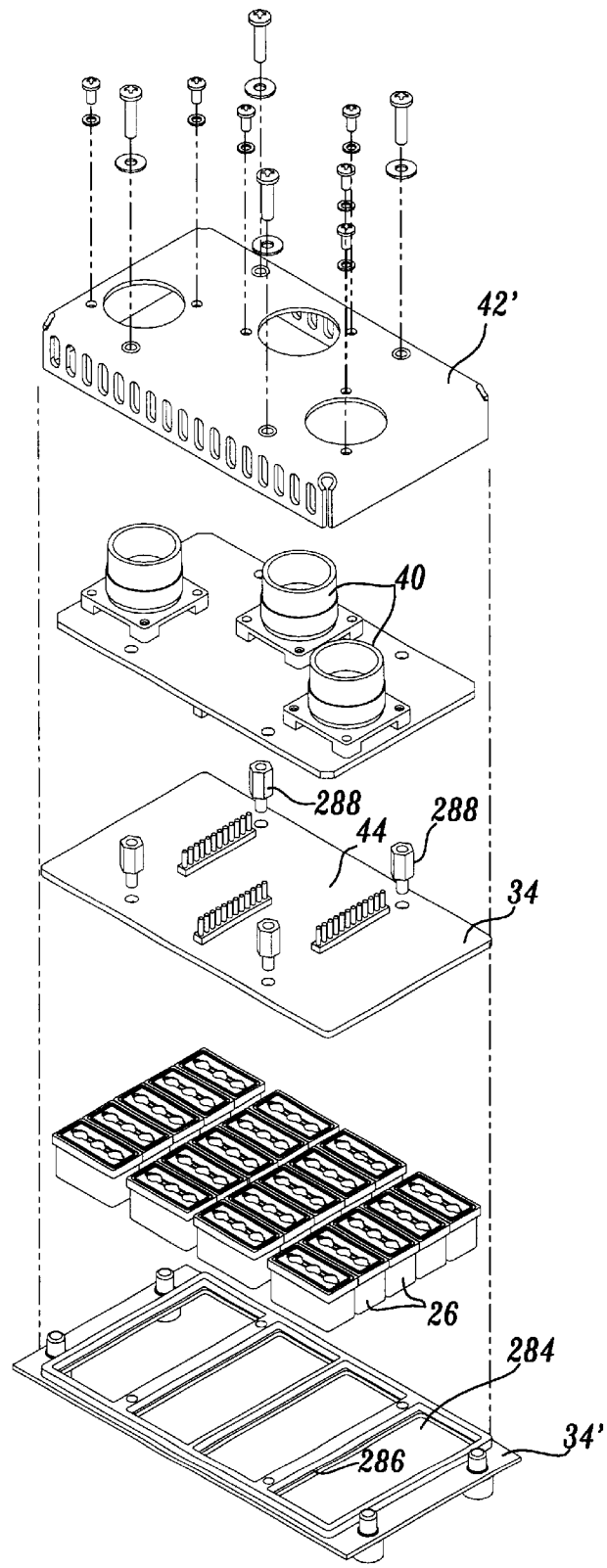
FIG. 33 is a top rear perspective of the module of FIG. 32, with parts shown in exploded relationship.

The annunciator assembly 26 is described above with reference to a single annunciator for a single hole through a machined front plate, such as any one of the holes 50 for the top two rows of the machined front plate shown in FIG. 9, for example, corresponding to the annunciators 26 of FIG. 1. Nevertheless, the design is adapted for flight deck panel modules consisting of banks of annunciators, such as the module 10' shown in FIG. 32. Each annunciator has the features (internal reflectors, lens, and cap) described above. With reference to FIG. 33, the machined front plate 34' can have long channels 284 with shoulders 286 for receiving rows of the annunciator assemblies 26, arranged side by side. The front PWA 34 retains the annunciator assemblies in position; compliant pin connectors 44 are provided for connecting the circuit of the front PWA 34 to the circuit of the rear PWA 38; and stand-offs 288 are provided for spacing the front and rear PWAs a desired distance apart. Mounting screws secure the rear cover 42' over the assembly such that the standard rear connectors 40 project rearward from the cover.

Figure 34:
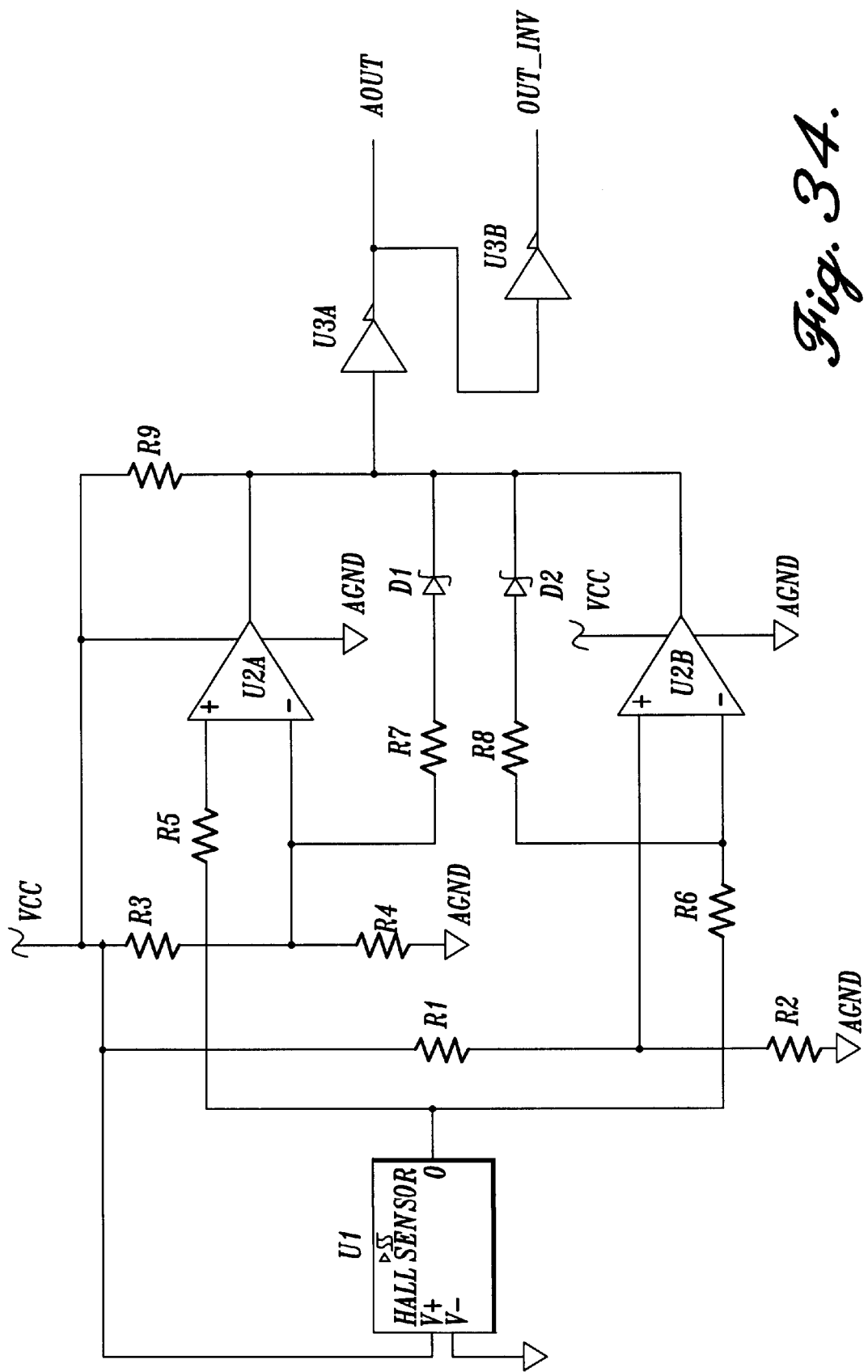
FIG. 34 is a diagram of a circuit useable in a solid state flight deck module in accordance with the present invention.

Circuitry for the modules in accordance with the present invention is designed to be compatible with modules currently in use. One complication is noted above, namely, the desirability of providing magnets in different orientations so that some sensors detect positive magnetic fields while others detect negative magnetic fields when the magnets are in close proximity to the sensors. For example, an appropriate solid state Hall effect sensor usable in the present invention is a model SS495 miniature ratiometric linear sensor, available from Honeywell. This sensor can be biased at 10 volts DC and have an output voltage signal that ranges linearly from 1 volt to 9 volts in response to magnetic field variations from −640 Gauss to +640 Gauss. A circuit appropriate for omnipolar sensing is shown in FIG. 34. The Hall effect sensor U1 is biased to 10 volts DC (Vcc) by a circuit of the type described below with reference to FIG. 37. The resistor divider formed by R3 and R4 establishes operate and release points for a comparator U2A for a positive magnetic field. Resistor divider R1 and R2 establishes operate and release points of comparator U2B for a negative magnetic field. The series resistor-diode networks R7, D1 and R8, D2 provide hysteresis for U2A and U2B, respectively, and both comparator open-collector outputs are wire ORed, with inverter buffer ICs U3A and U3B driving the output loads. Comparator operate and release thresholds have been set at sufficiently high levels that the circuit is immune to lightning induced transient magnetic fields. This eliminates the need for additional filtering, as could be required with other off-the-shelf digital Hall effect position sensors.

Design thresholds for the Hall sensors are ±385 Gauss operate and ±250 Gauss release. The lightning induced transient field has been calculated to be a maximum of ±200 Gauss. Worst case field strength calculations show a maximum of 600 Gauss when any switch is in the on position (magnet close to a sensor). Therefore, an on device will not turn off in response to the lightning transient, and neither will sensor thresholds allow an off device to be turned on. Another consideration is the possibility of current in a wire bundle creating a magnetic field sufficient to operate a switch. Calculations have determined that wire bundles greater than 2.2 inches from a Hall sensor will not cause the sensor to change state, even during a lightning transient.

Outputs from the circuit of FIG. 34 are appropriate for any on-off condition, such as is desired for a toggle switch, rotary switch, or push button switch of the type described above. In order to emulate a mechanical switch, which may switch standard aircraft power of 28 volts or a lesser voltage, such as 10 volts, depending on the circuit, the output of the circuit of FIG. 34 is used with a driver circuit. High side (28 volts) and low side (10 volts) driver circuits can be used, triggered by the output of the circuit of FIG. 34, as represented by FIG. 35.

Rheostats require circuits providing a varying output depending on the position of a rotary knob. The preferred miniature ratiometric linear Hall effect sensor (Honeywell SS495) does provide a linear output. However, the linear output from the Honeywell sensor must be converted by a circuit to be proportional to knob rotation. With reference to FIG. 36, a supply voltage (28 volts DC aircraft power—nominally 18 to 32 volts DC with higher and lower transients) is acted on by a regulator to convert the supply voltage to a regulated voltage appropriate for Hall effect sensor and supporting circuitry. The regulator preferably also provides filtering and transient protection. An example application circuit is based on a National Semiconductor LM317. With reference to FIG. 37, the regulated voltage is applied to the Hall effect sensor 59, such as 5 volts in a representative embodiment. The sensor output is proportional to the detected magnetic field. For the Honeywell SS495, with no ambient magnetic flux, the sensor output is 0.5 times the regulated voltage or 2.5 volts in the representative circuit. Sensor output voltage will increase to a maximum of 4.5 volts in this example as ambient flux increases from 0. The sensor output voltage decreases to a minimum of 0.5 volts as ambient flux decreases from 0, i.e., goes negative. A buffer amplifier normalizes the Hall sensor voltage to a 0 to 5 volt range. This is accomplished by canceling the Hall effect zero flux offset, then amplifying the result by an appropriate gain. By selecting an appropriate regulated voltage for the desired Hall effect sensor, and appropriate gain characteristics for the buffer amplifier, the analog position output will be effected. Other circuitry is added as required to control lamps, audio volume, heat controls, etc.

Figure 38:
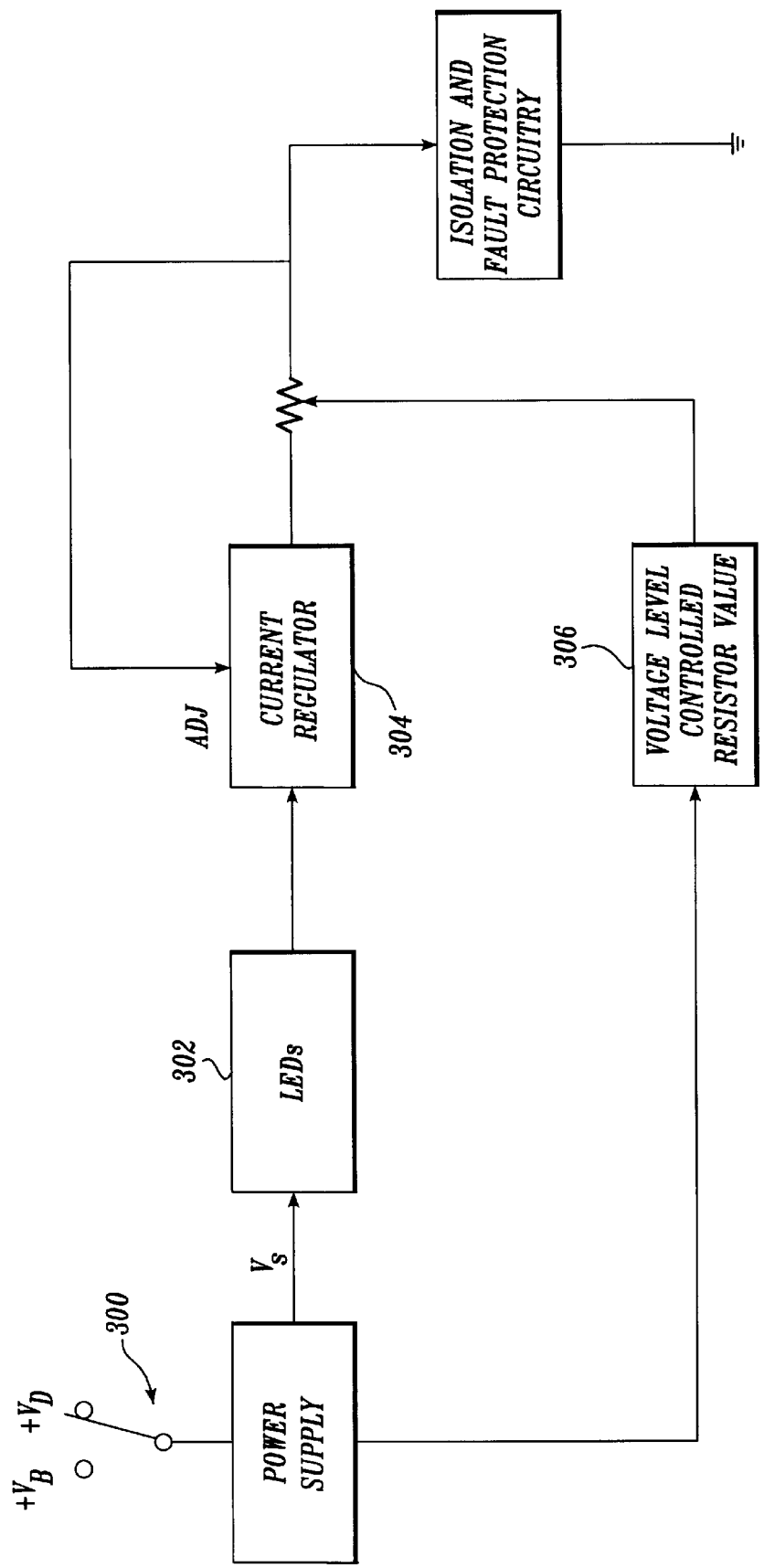

The annunciator current regulator circuit provides a constant current drive to illuminate LED indicator devices. Previous technology utilizes incandescent lamps requiring approximately 80 milliamps per indicator. Lamp intensity varies considerably with fluctuations of the 28 volt DC bus voltage applied to the lamps. The new approach drives a fixed current through a string of LEDs that consume less than one quarter of the current required by incandescent lamps. The current level and thereby the intensity of the indicators are closely regulated using a two level regulator circuit, which can be of the general type shown in FIG. 38. The indicator illumination level is solely determined by the voltage $V_s$ supplied to the indicators, represented by box 302. This input voltage is set by the flight crew by selecting a bright or dim illumination level ($V_b$ or $V_d$) through the master dim and test switch 300. The output current to the indicator, determined by a regulator 304, is then selected to be at a bright or dim level via a comparator circuit 306 which determines whether the input voltage is above or below a threshold level, in this case 16 volts, which then regulates the current at the fixed dim or bright level.

FIGS. 39–43 illustrate the improved electrical connector 49' which mates with the light plate electrical connector 49. In prior constructions, a standard connector would be one more component to be separately wired and fitted on the light plate connector 49. In accordance with the present invention, a compact, durable, and reliable connector 49' can be mounted on the front PWA 34. Power to components of the connector 49' and mating connector 49 can be conveyed by way of conductive traces 310 and 312 formed as part of the board.

Figure 42:
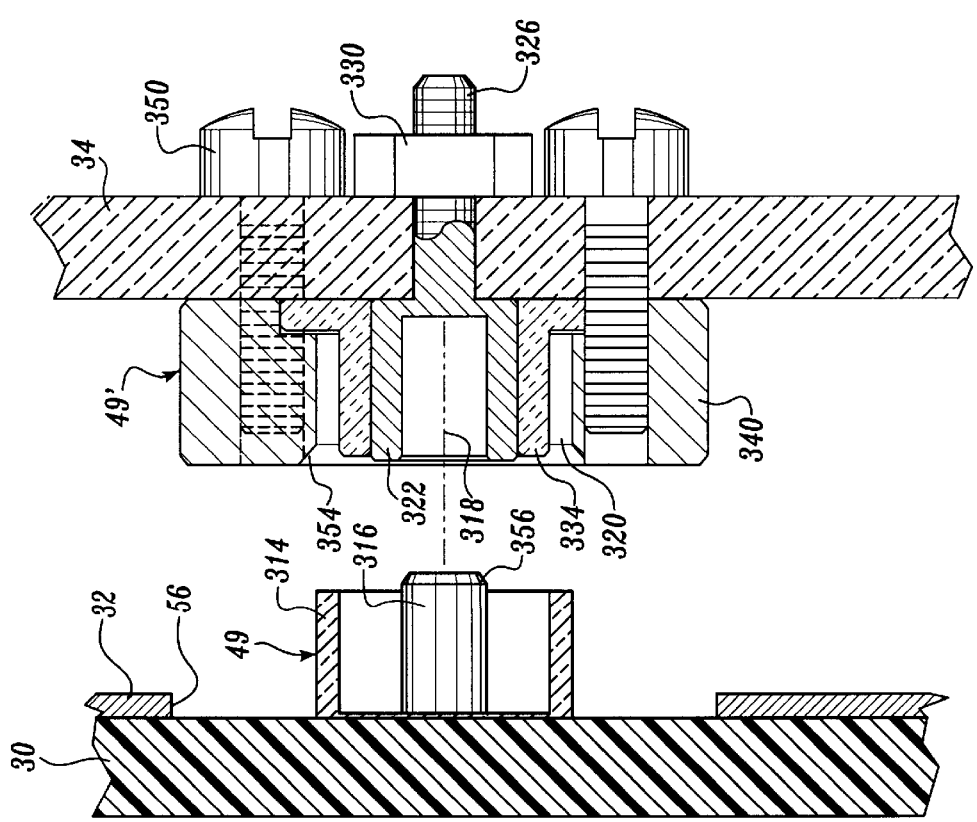

With reference to FIG. 42, the standard light plate connector 49 has two conductors or contacts, an outer annular contact 314, and an inner, central pin contact 316, both projecting rearward from the light plate 30. The connector 49' in accordance with the present invention provides a central socket 318 for closely receiving the pin contact 316, and an annular groove 320 for receiving the annular contact 314.

Figure 39:
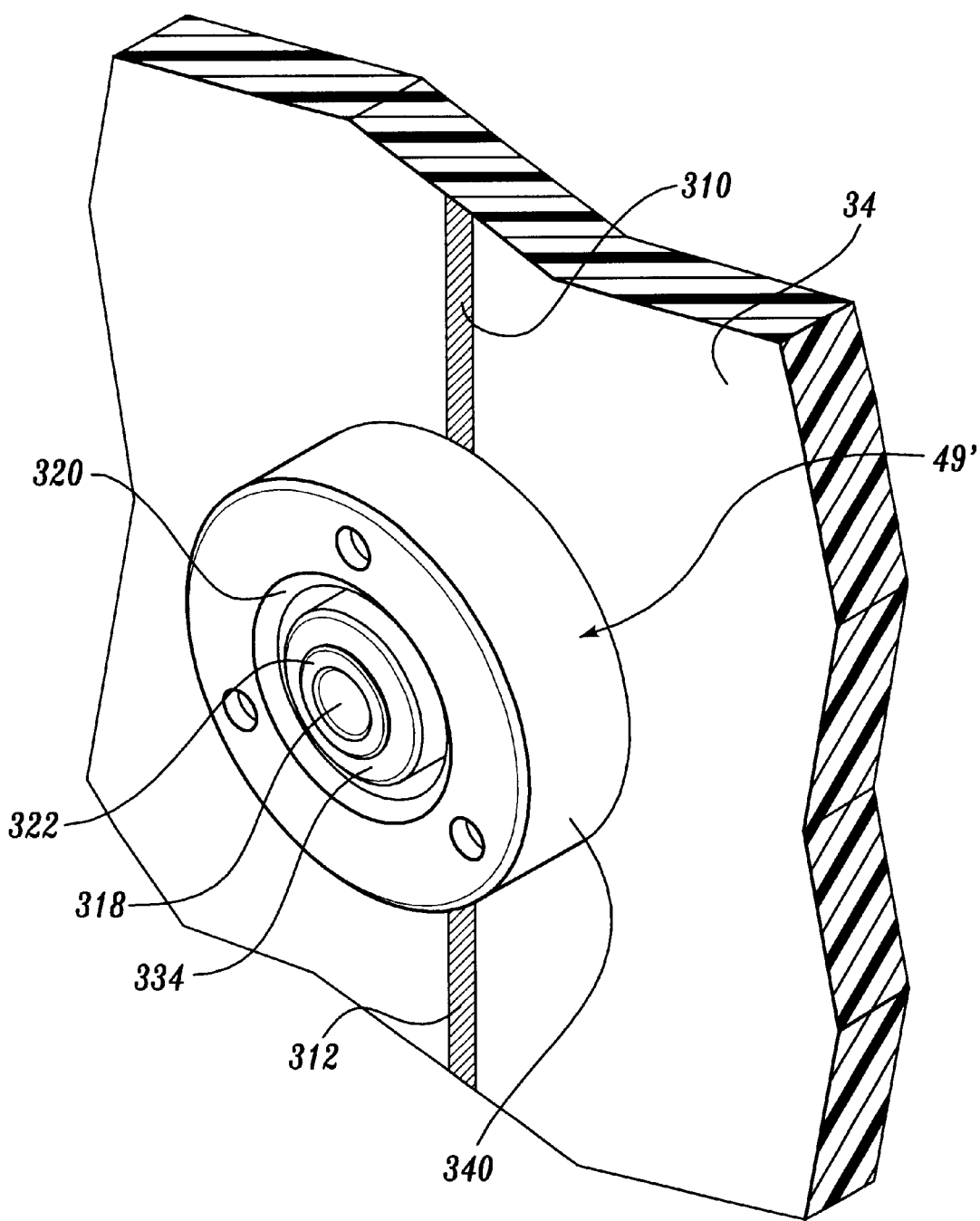
FIG. 39 is a top front fragmentary perspective of a portion of a printed wiring assembly useable in the present invention, illustrating a novel electrical connector to mate with a standard connector of a conventional light plate.

More specifically, with reference to FIGS. 39–41, connector 49' has a center electrically conductive stud 322 with an enlarged head 324 having a blind bore forming the socket 318, and a threaded shank 326 extending rearward from the head 324 to pass through a hole 328 in the front PWA 34. The rear face of the head 324 is in electrically conductive engagement with the trace 312, and the stud is secured stably in position by a nut 330. A lock washer can be interposed between the nut 330 and the rear face of the PWA 34. An insulator 332 has a hub portion 334 with a bore 336 that fits snugly over the head end 324 of the stud 322. The insulator also includes an insulative rear flange 338 that butts against the front side of the wiring board.

An outer contact ring 340 has a large central bore 342 that fits loosely over the hub 334 of the insulator 332. The rear face of the outer contact ring is illustrated in FIG. 41. There is an annular recess or step 344 which is sized to receive the insulator flange 338 such that the rear face 346 of the outer contact ring will engage the front face of the PWA 34. Recess or step 344 communicates with a shallow groove 348 in the area where the contact ring extends over the trace 312 leading to the center stud 322. Face 346 is in electrical contact with the other trace 310. The outer contact ring is secured in position by screws 350 which have externally threaded shanks received in internally threaded holes 352 of the outer contact ring. When assembled, as seen in FIG. 39, contact ring 340 is stationary relative to the PWA 34, with the electrically conductive outer contact ring 340 in electrical contact with trace 310, and with the inner stud 322 in electrical contact with the trace 312, but with the stud and outer contact ring and the two traces electrically insulated from each other.

As best seen in FIG. 42, the connector 49' is secured on the PWA 34 so that the groove 320 between the insulator hub 334 and the inner periphery of the bore through the outer contact ring 340 is aligned with the contact ring 314 of the light plate connector 49. Preferably the contact ring has a slight bevel 354 to assist in centering the light plate outer contact 314 in the groove 320. Also, the insulator can be a rigid slippery material, such as Teflon, which has some resiliency for a snug fit of the contact ring 314 in the groove 320.

Figure 43:
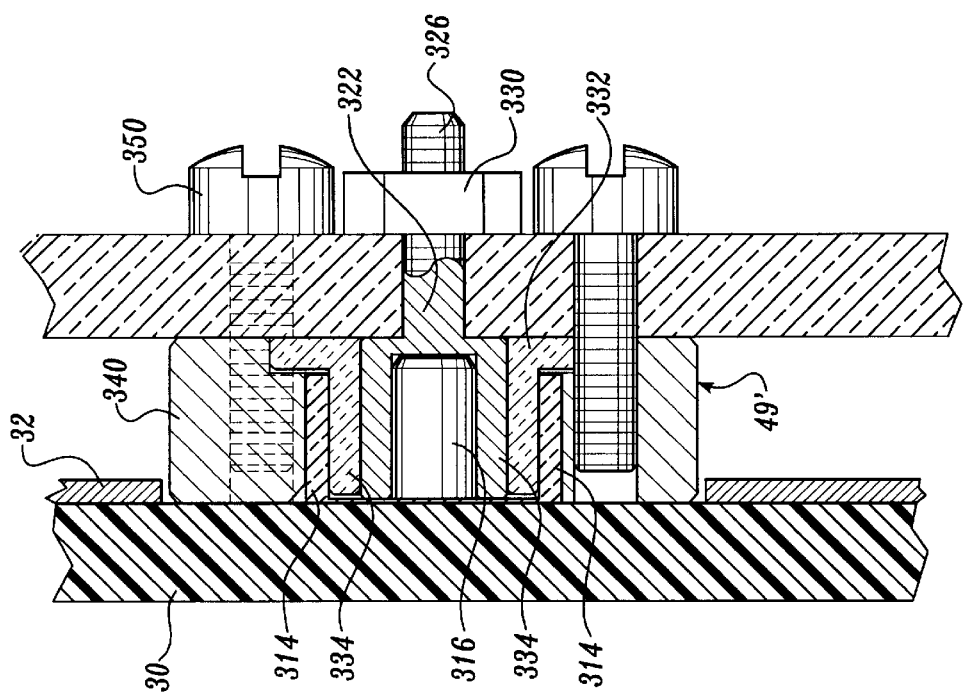
FIGS. 42 and 43 are vertical sections through the connector and an adjacent light plate, with parts in different positions.

Similarly, the center pin contact 316 of light plate connector 49 can have a beveled end 356 to assist in guiding the pin into the socket 318 of the stud 322. The assembled condition is shown in FIG. 43 where the two connectors are mating and the uniform distance between the front mounting plate 32 and PWA 34 are maintained. Separate wiring for the connector 49' is not required, but can be incorporated into the PWA 34 by way of the traces 310, 312.

While the preferred embodiment of the invention has been illustrated and described, it will be appreciated that various changes can be made therein without departing from the spirit and scope of the invention.

What is claimed is:

1. A rheostat for a systems control panel having a front plate and a front PWA spaced a predetermined distance from the front plate, said rheostat comprising a rotary operating knob, a housing having at least one cylinder, a piston mounted in the cylinder and carrying a magnet, the piston being interconnected with the operating knob such that rotation of the knob moves the piston in the cylinder toward and away from the PWA, and the PWA having a Hall effect sensor mounted for detecting movement of the piston relative to the PWA, in which the operating knob includes a cam disk rotatable with the remainder of the operating knob, the cam disk having a helical cam slot, the piston having a member for riding in the cam slot such that rotation of the operating knob moves the piston toward and away from the PWA, the degree of travel of the piston for a given amount of rotation of the operating knob being predetermined by the slope of the cam slot.

2. The rheostat defined in claim 1, including multiple operating knobs rotatable about a common axis, each of said operating knobs including an associated cam disk, and each cam disk interfitting with a magnet carrying piston such that by turning one of the operating knobs one piston is moved toward or away from the PWA whereas by turning the other of the knobs the other piston is moved toward or away from the PWA.

3. A systems control panel comprising:
a front plate of heat conductive material;
a front PWA spaced a predetermined uniform distance from the front plate and having a front surface adjacent to the front plate and a rear surface remote from the front plate, the front PWA including two internal thermal planes closely adjacent to the front and rear surfaces, respectively, and separated by thermally insulating material of a thickness greater than the distance from each thermal plane to the adjacent surface of the PWA;
a heat conductive housing coupled to the front plate and the front PWA for dissipation of heat from heat producing components of the front PWA by way of the thermal planes; and
a plurality of systems control devices including one or more of switches, rheostats and annunciators mounted on the front plate and front PWA, the front PWA having circuitry for the systems control devices, and each of the systems control devices having solid state elements mounted on the front PWA and interacting with the circuitry thereof.

4. The panel defined in claim 3, the front PWA having thermal vias extending from the front and rear surfaces to the adjacent thermal planes, respectively, for conducting heat along the vias and along the thermal planes to the housing and the front plate.

5. The panel defined in claim 3, in which the systems control devices include LEDs mounted on the front surface of the PWA and heat generating components for powering the LEDs mounted on the rear surface of the PWA.

6. The panel defined in claim 3, in which the rear surface of the PWA is thermally coupled to the housing and the front surface of the PWA is thermally coupled to the front plate.

7. The panel defined in claim 3, in which the systems control devices include a plurality of switches, each switch having a manually moved actuator, the actuator including a magnet carrier, and the front PWA including a Hall effect sensor for detecting when the magnet carrier is in close proximity to the sensor.

8. The panel defined in claim 3, in which the systems control devices include a plurality of different types of switches selected from the group consisting of toggle switches, rotary switches and push button switches, the PWA having a plurality of Hall effect sensors mounted thereon, and each switch having a magnet associated with one or more of the Hall effect sensors for detecting whether or not the magnet is in close proximity to the associated Hall effect sensor.

9. The panel defined in claim 3, in which the systems control devices include a toggle switch having an actuating lever moveable in one plane, the actuating lever extending through the front plate and the front PWA and having a magnet carrier disposed to the rear of the PWA with respect to the front plate, the PWA having a Hall effect sensor mounted thereon for detecting the position of the magnet carrier by interaction with the sensor.

10. The panel defined in claim 3, in which the systems control devices include a plurality of toggle switches each including an actuating lever moveable in one plane and a magnet carrier disposed on the actuating lever adjacent to the front PWA, the front PWA having a plurality of Hall effect sensors each positioned for interacting with a magnet carrier of one of the toggle switches.

11. The systems control panel defined in claim 3, in which the systems control devices include a rotary switch having a first rotary actuating knob and a first magnet carrier moved by rotation of the first actuating knob, the front PWA having a first Hall effect sensor positioned for detecting movement of the first magnet carrier for interaction with circuitry of the PWA.

12. The panel defined in claim 11, including a second rotary actuating knob, and a second magnet carrier moved by rotation of the second actuating knob, the front PWA having a second Hall effect sensor positioned for detecting movement of the second magnet carrier for interaction with the circuitry of the PWA.

13. The panel defined in claim 12, in which the first and second rotary actuating knobs are rotatable about a common axis independently of each other.

14. The panel defined in claim 12, in which the first and second rotary actuating knobs are rotatable about a common axis.

15. The panel defined in claim 14, in which the first and second rotary actuating knobs are interconnected such that by rotating the first rotary actuating knob through a first predetermined angle both the first and the second magnet carriers automatically move through a predetermined angle.

16. The panel defined in claim 15, in which the first and second rotary actuating knobs are interconnected such that by moving the first rotary actuating knob beyond the first predetermined angle, the first magnet carrier is moved without corresponding movement of the second magnet carrier.

17. The panel defined in claim 3, in which the systems control devices include a push button switch including an actuator button having a base portion, the base portion being slideable through the front PWA and carrying an actuator bar, a magnet carrier coupled to the actuator bar and having magnets thereon, a Hall effect sensor mounted on the PWA for detecting movement of the magnet carrier relative to the Hall effect sensor, and a detent mechanism for positioning of the actuator bar and the magnet carrier based on linear movement of the button.

18. The panel defined in claim 17, in which the push button switch operates as an alternate action, push on, push off, mechanism.

19. The panel defined in claim 3, in which the systems control devices include a rheostat having a rotary operating knob, a housing having at least one cylinder, a piston mounted in the cylinder and carrying a magnet, the piston being interconnected with the operating knob such that rotation of the knob moves the piston in the cylinder toward and away from the PWA, and the PWA having a Hall effect sensor mounted for detecting movement of the piston relative to the PWA.

20. The panel defined in claim 19, in which the operating knob includes a cam disk rotatable with the remainder of the operating knob, the cam disk having a helical cam slot, the piston having a member for riding in the cam slot such that rotation of the operating knob moves the piston toward and away from the PWA, the degree of travel of the piston for a given amount of rotation of the operating knob being predetermined by the slope of the cam slot.

21. The panel defined in claim 20, including multiple operating knobs rotatable about a common axis, each of said operating knobs including an associated cam disk, and each cam disk interfitting with a magnet carrying piston such that by turning one of the operating knobs one piston is moved toward or away from the PWA whereas by turning the other of the knobs the other piston is moved toward or away from the PWA.

22. The panel defined in claim 3, in which the systems control devices include an annunciator including a plurality of LEDs mounted on the PWA and a housing assembly mounted in the front plate, the housing assembly including a reflective inner surface, and the cross-sectional area of the housing assembly reflective surface decreasing adjacent to the end of the housing assembly remote from the PWA.

23. The panel defined in claim 22, including a lens mounted in the housing assembly adjacent to the end of the housing assembly remote from the PWA, the lens including an outer layer of neutral density attenuating material, an inner layer of neutral density attenuating material, and a central photographic emulsion legend layer disposed between the inner and outer layers.

24. The panel defined in claim 23, in which the housing assembly has an inner periphery of generally parabolic shape for disbursing light emitted from the annunciator assembly at large angles for increased side viewing of the annunciator.

25. The panel defined in claim 3, including a light plate secured to the front plate and having a first electrical connector projecting from a face thereof, the front PWA being spaced a predetermined uniform distance from the light plate and having a second electrical connector mounted thereon, fitted between adjacent surfaces of the light plate and the front PWA, and having one or more contacts in electrical engagement with one or more contacts of the connector of the light plate, the front PWA having electrical traces for conveying electrical power to the one or more contacts of the PWA for transmission to the one or more contacts of the first electrical connector of the light plate.

26. The panel defined in claim 3, in which the front PWA includes power and ground planes, separate from the thermal planes, for the systems control devices.

27. A systems control panel comprising:
a front plate of heat conductive material;
a front PWA spaced a predetermined uniform distance from the front plate and having a front surface adjacent to the front plate and a rear surface remote from the front plate, the front PWA including an internal thermal plane closely adjacent to one of the front and rear surfaces and separated from the other of the front and rear surfaces by thermally insulating material of a thickness greater than the distance from the thermal plane to said one surface of the front PWA;
a heat conductive housing coupled to the front PWA for dissipation of heat from heat producing components mounted at one of the surfaces of the front PWA; and
a plurality of systems control devices including one or more of switches, rheostats and annunciators mounted on the front plate and front PWA, the front PWA having circuitry separate from the thermal plane for the systems control devices, and each of the systems control devices having solid state elements mounted on the front PWA and interacting with the circuitry thereof.

28. The panel defined in claim 27, in which the front PWA includes ground and power planes, separate from the thermal plane, for the systems control devices.

29. The panel defined in claim 27, the front PWA having thermal vias extending from at least one of the front and rear surfaces to the thermal plane for conducting heat along the vias and along the thermal plane to the housing.

30. The panel defined in claim 27, in which the systems control devices include a plurality of switches mounted on the front plate, each switch having a manually moved actuator moveably mounted on the front plate and including a magnet carrier, and the front PWA having a plurality of Hall effect sensors stationarily mounted thereon; at least one such sensor being associated with each of the magnet carriers for detecting when the magnet carrier is in close proximity to such associated sensor, whereby the plurality of sensors mounted on the front PWA detect and signal switch positions of the plurality of actuators mounted on the front plate.

31. A systems control panel comprising:

a front plate of heat conductive material;

a front PWA spaced a predetermined uniform distance from the front plate and having a front surface adjacent to the front plate and a rear surface remote from the front plate, the front and rear surfaces being separated by a thickness of thermally insulating material sufficient to achieve substantial thermal isolation of the front and rear surfaces;

a heat conductive housing coupled to the rear surface of the front PWA for dissipation of heat from heat producing components at the rear of the front PWA, the front surface of the PWA being thermally coupled to the front plate; and a plurality of systems control devices including one or more of switches, rheostats and annunciators mounted on the front plate and front PWA, the front PWA having circuitry for the systems control devices, and each of the systems control devices having solid state elements mounted on the front PWA and interacting with the circuitry thereof.

32. The panel defined in claim 31, in which the front PWA includes a thermal plane of heat conducting material for conveying heat to the housing.

33. The panel defined in claim 32, in which the front PWA includes ground and power planes, separate from the thermal plane, for the systems control devices.

34. The panel defined in claim 31, in which the systems control devices include a plurality of switches mounted on the front plate, each switch having a manually moved actuator moveably mounted on the front plate and including a magnet carrier, and the front PWA having a plurality of Hall effect sensors stationarily mounted thereon; at least one such sensor being associated with each of the magnet carriers for detecting when the magnet carrier is in close proximity to such associated sensor, whereby the plurality of sensors mounted on the front PWA detect and signal switch positions of the plurality of actuators mounted on the front plate.

35. A systems control panel comprising:

a front plate of heat conductive material;

a front PWA spaced a predetermined uniform distance from the front plate and having a front surface adjacent to the front plate and a rear surface remote from the front plate, the front PWA including internal ground and power planes and at least one separate thermal plane of heat conducting material, the front and rear surfaces being separated by thermally insulating material of a thickness sufficient to substantially thermally isolate the front and rear surfaces;

a heat conductive housing coupled to the front plate and the front PWA and in thermal contact with at least one of the front plate and the housing for dissipation of heat from heat producing components of the front PWA by way of the thermal plane; and a plurality of systems control devices including one or more of switches, rheostats and annunciators mounted on the front plate and front PWA, the front PWA having circuitry for the systems control devices, and each of the systems control devices having solid state elements mounted on the front PWA and interacting with the circuitry thereof.

36. The panel defined in claim 35, in which the systems control devices include a plurality of switches mounted on the front plate, each switch having a manually moved actuator moveably mounted on the front plate and including a magnet carrier, and the front PWA having a plurality of Hall effect sensors stationarily mounted thereon, at least one such sensor being associated with each of the magnet carriers for detecting when the magnet carrier is in close proximity to such associated sensor, whereby the plurality of sensors mounted on the front PWA detect and signal switch positions of the plurality of actuators mounted on the front plate.

* * * * *